United States Patent
Liu et al.

(10) Patent No.: US 11,144,023 B1
(45) Date of Patent: Oct. 12, 2021

(54) METHOD FOR PMU DATA RECOVERY USING AN IMPROVED CUBIC SPLINE INTERPOLATION AND SINGULAR VALUE DECOMPOSITION

(71) Applicant: NORTH CHINA ELECTRIC POWER UNIVERSITY, Beijing (CN)

(72) Inventors: Hao Liu, Beijing (CN); Tianshu Bi, Beijing (CN); Zhiwei Yang, Beijing (CN)

(73) Assignee: North China Electric Power University, Beijing (CN)

( * ) Notice: Subject to any disclaimer, the term of this patent is extended or adjusted under 35 U.S.C. 154(b) by 0 days.

(21) Appl. No.: 17/157,709

(22) Filed: Jan. 25, 2021

Related U.S. Application Data

(63) Continuation of application No. 17/015,798, filed on Sep. 9, 2020, now Pat. No. 10,983,492, which is a continuation of application No. PCT/CN2020/107979, filed on Aug. 7, 2020.

(51) Int. Cl.
*G05B 19/042* (2006.01)
*H04L 29/08* (2006.01)

(52) U.S. Cl.
CPC .... *G05B 19/042* (2013.01); *G05B 2219/2639* (2013.01); *H04L 67/12* (2013.01)

(58) Field of Classification Search
CPC .......... G05B 19/042; G05B 2219/2639; H04L 67/12
See application file for complete search history.

(56) References Cited

PUBLICATIONS

Yang, Zhiwei et al., "An Adaptive PMU Missing data recovery method" Electrical Power and Energy Systems, 116, pp. 1-14, 2020, 105577.

*Primary Examiner* — Yuhui R Pan
(74) *Attorney, Agent, or Firm* — Hunton AK, LLP

(57) ABSTRACT

A data recovery method framework is described, in which the data is classified as either ambient or disturbance data, and recovered by different methods to achieve good performance efficiently. An approach based on decision tree is described for identifying ambient and disturbance data. Then, an improved cubic spline interpolation based on the priority allocation strategy is described for ambient data loss, which can quickly and accurately recover ambient data. Simultaneously, a disturbance data recovery method based on singular value decomposition is described. It can achieve disturbance data recovery accurately by a single channel of measurement.

1 Claim, 24 Drawing Sheets

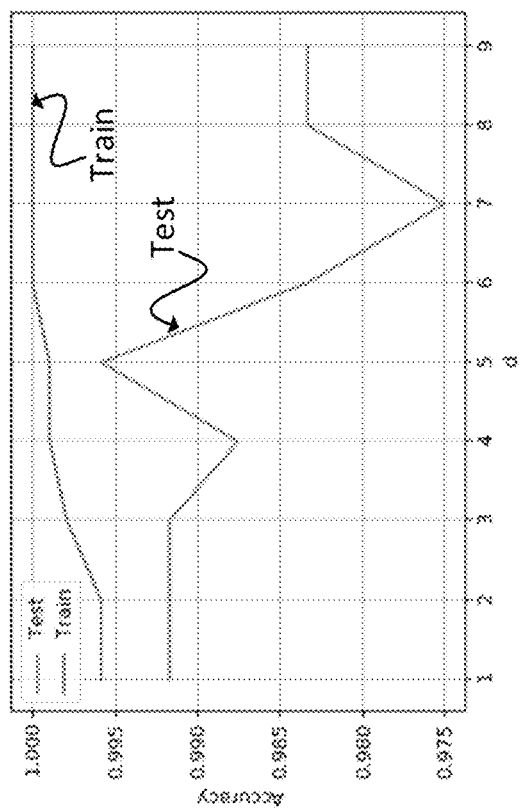
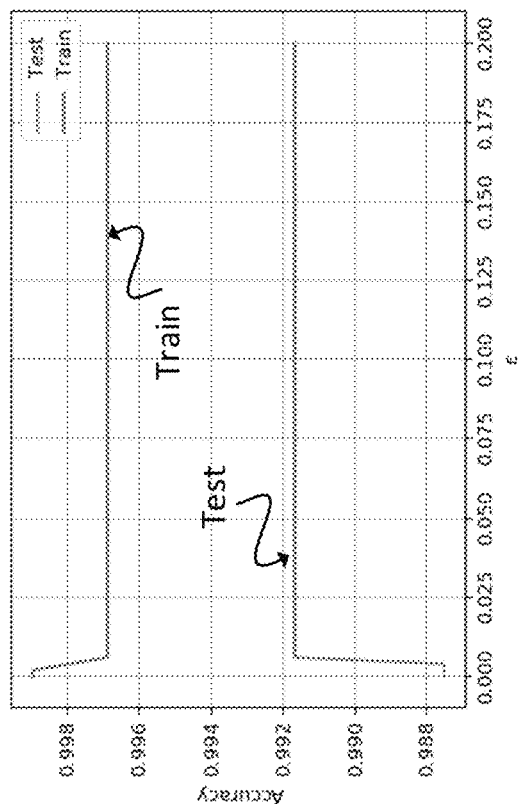
FIG. 4B
FIG. 4A

METHOD FOR PMU DATA RECOVERY USING AN IMPROVED CUBIC SPLINE INTERPOLATION AND SINGULAR VALUE DECOMPOSITION

BACKGROUND

A high penetration of renewable energies into the modern grid creates randomness and uncertainties which require advanced real-time monitoring and control. Phasor measurement units (PMUs) and wide-area measurement systems (WAMS) show great promise for operation monitoring and stability enhancement due to characteristics of synchronization, rapidity, and accuracy. However, different levels of data loss issues can occur in practical applications as a result of varying conditions, including communication congestion, hardware failure, and transmission delay. Data loss issues can severely restrict such monitoring applications in power systems, and may even threaten the security of the grid.

SUMMARY

To address this problem, an adaptive PMU missing data recovery method is described in this disclosure. A data recovery method framework is described, in which the data is classified as either ambient or disturbance data, and recovered by different methods to achieve good performance efficiently. An approach based on decision tree is described for identifying ambient and disturbance data. Then, an improved cubic spline interpolation based on the priority allocation strategy is described for ambient data loss, which can quickly and accurately recover ambient data. Simultaneously, a disturbance data recovery method based on singular value decomposition is described. It can achieve disturbance data recovery accurately by a single channel of measurement. Finally, the feasibility and accuracy of the described methods are verified through simulation and hardware-based test platform fed by field recorded data. The simulation and testing results show that this method can achieve data identification and recovery efficiently solely based on data, and that applying the described method to all aspects of the power system can provide superior PMU measurement guarantees.

BRIEF DESCRIPTION OF THE DRAWINGS

In order to facilitate a fuller understanding of the present invention, reference is now made to the attached drawings. The drawings should not be construed as limiting the present invention, but are intended only to illustrate different aspects and embodiments of the invention.

FIG. 4A shows exemplary results of optimal parameters.

FIG. 4B shows exemplary results of optimal parameters.

DETAILED DESCRIPTION

Figure 1:
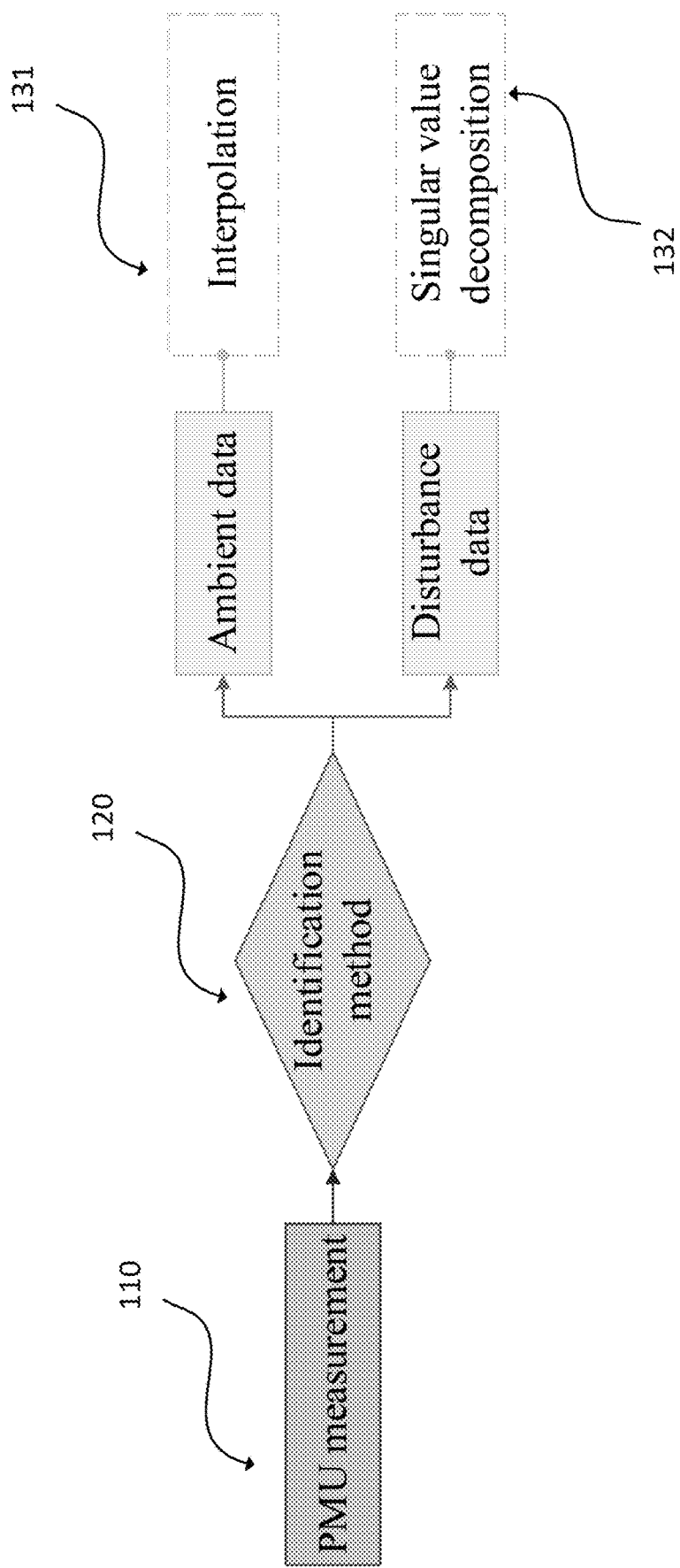
FIG. 1 shows an example framework diagram of a data recovery algorithm.

Exemplary embodiments of the invention will now be described in order to illustrate various features of the invention. The embodiments described herein are not intended to be limiting as to the scope of the invention, but rather are intended to provide examples of the components, use, and operation of the invention.

1. Introduction

The largest and most complex interconnected power system in the world has been built in China, which holds the highest transmission voltage level and largest capacity of renewable energy globally. However, the operation modes and dynamic characteristics of the system have become increasingly complicated due to the growing scale of the grid, penetration level of renewables, and integration of distributed generations. Real-time monitoring and precise close-loop control are required to ensure the stability of the grid, and can be carried out by phasor measurement units (PMUs) owing to its synchronization, rapidity, and accuracy. Potential applications based on PMU data, including state estimation, parameter identification, and wide-area protection and control, have also drawn much attention recently. At present, about 3000 PMUs have been installed and put into operation in China, covering the majority of 220 kV and above substations, main power plants, and grid-connected renewable energy collections. In addition, it is reported that around 2500 commercial PMUs have been installed in North America.

Due to communication congestion, hardware failures, transmission delays, and other issues, on-site PMUs typically experience different degrees of data quality issues. According to the 2011 Five-Year Plan issued by the California Independent System Operator, around 10 to 17% of PMU data in North America corrupted, and this ratio is as high as 20 to 30% in China. The quality of PMU data severely restricts its various applications in the power system, in which data loss is a key factor affecting data quality. Loss of PMU data can lead to reduced system observability, affecting state estimation and parameter identification, and even threatening grid security. Therefore, restoring PMU missing data has become increasingly important.

Some use PMU data recovery methods such as interpolation, low-rank matrix method, sparse matrix method, and state estimation method. Based on the statistics of PMU data loss in North America, a Lagrange interpolation method for effectively recovering lost data has been considered. The time-series prediction model can be combined with Kalman filtering and smoothing algorithm, and a PMU data adjustment method can be presented to effectively improve data accuracy. The methods based on linear interpolation are simple and easy to calculate, but when there is the disturbance data, the recovery accuracy is low. To improve data quality, an online algorithm according to the low-rank characteristics of PMU data can be used. By exploiting PMU measurement to construct a Hankel matrix, this method can effectively recover missing data. In addition, some have considered data recovery from the perspective of data sparsity, and the state space model and constructor function can be used to predict the frequency changes of power systems. Although these methods can recover ambient data, there are still few adequate recovery methods for disturbance data. At the same time, 95% of data loss events only involve up to three contiguous data points, and a large number of contiguous data loss or non-contiguous data loss occurs much less frequently. Therefore, it is desirable to develop an algorithm that can effectively recover the contiguous loss of ambient and disturbance data.

In this disclosure, an adaptive PMU missing data recovery method is described. Aiming at the different features of ambient and disturbance data, a data identification method based on a decision tree is presented. It can effectively identify data even when large amounts of data are lost. On this basis, for the ambient data, a recovery method based on improved cubic interpolation with a priority allocation strategy is described, which can recover the data precisely with low calculation burden. For the disturbance data, a recover method based on singular value decomposition is described, which can recover disturbance data only relying on a single channel PMU measurement even when the data loss ratio is high. Finally, the described method is tested by simulation and field recorded data. Results show that this method can select an appropriate method for recovery according to the data state, which increases the calculation precision and the calculation efficiency compared with the existing methods. The findings demonstrate that PMU measurement is better applied to all aspects of the power system by using this method.

2. Data Recovery Method Framework

When the power system is in steady state for a long time, its measurement data is ambient and easy to recover. Under such conditions, the interpolation algorithm can effectively recover the missing data, and the calculation is simple and efficient. However, when there is disturbance in the system, the measurement changes nonlinearly, and is difficult to recover the missing data by interpolation which requires a more complicated algorithm. This disclosure describes an adaptive PMU missing data recovery algorithm which can achieve accurate recovery of different kinds of missing data.

FIG. 1 shows an example framework diagram of a data recovery algorithm. In this example embodiment, in step 110, the PMU measurement (data) is obtained. In step 120, the data is divided into ambient data and disturbance data. In step 131, the ambient data is restored by a recovery algorithm based on interpolation. In step 132, the disturbance data is restored by singular value decomposition.

At the same time, in order to simplify the model, the missing data of field PMUs is analyzed and the three types of data loss are summarized as single data loss type, contiguous data loss type, and non-contiguous data loss type. Note that the non-contiguous data loss type can be equivalent to the combination of the above two types.

3. Ambient and Disturbance Data Identification Method 3.1. Construction of Decision Tree The identification of ambient and disturbance data can be considered equivalent to a binary classification problem. The C4.5 decision tree, a tool in machine learning, can be adopted here to solve this problem, because it uses the information gain ratio to select features instead of the information gain in the ID3 algorithm to avoid the preference for features with more values.

Figure 2:
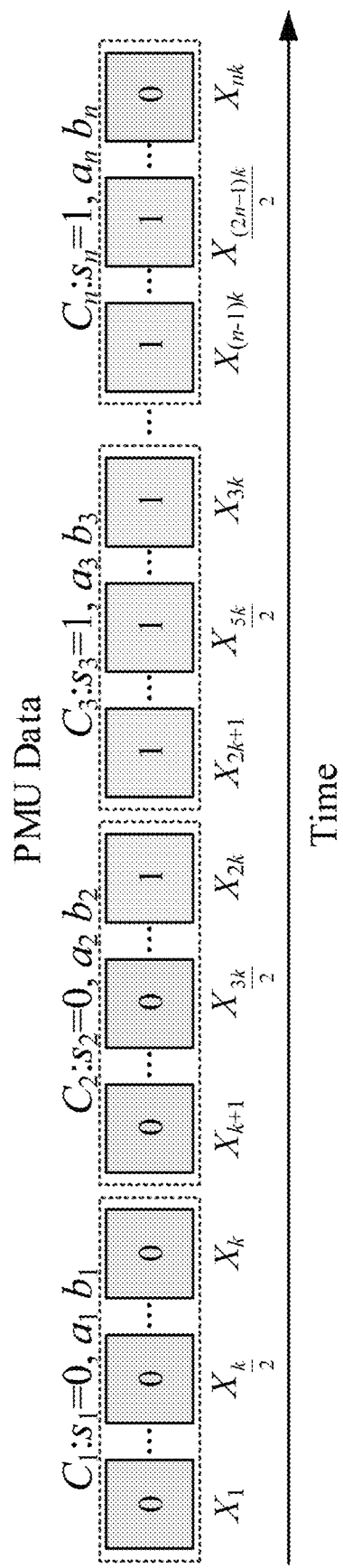
FIG. 2 shows an example diagram of a data group.

FIG. 2 shows an example diagram of a data group. Assuming the field PMU data set from a single channel PMU measurement has a sequence of $N=k \cdot n$ data points, $D=X_1, X_2, \ldots, X_N$ over time window t. As shown in FIG. 2, the dataset is divided into n groups ($C_1, C_2, \ldots, C_n$). Each data $X_i \in D$ is associated with its measurement and system state flag.

FIG. 2 indicates that there are n groups of data ($C_1, C_2, \ldots, C_n$), and $N=k \cdot n$. All the data is labelled as ambient and disturbance data according to whether there is an oscillation or just relative constant data with noise. The label of ambient data is 0 and the label of disturbance data is 1. The state label $s_i$ of each group is determined by its internal data, for example $s_1=0$, $s_3=1$. If there are two kinds of data in the group, the state of the group is determined by the kind of the majority, for example $s_2=0$, $s_n=1$. In addition, the variance a and extreme value difference $b_i$ are calculated as the features in each group. The variance a indicates the deviation of amplitudes in a group. The extreme value difference $b_i$ indicates the difference between the maximum and minimum amplitudes. Then, 80% of groups are randomly selected as the training set T, and the remaining 20% are the test set T'. The training data is used to form a decision tree. The test data is used to verify the accuracy of the decision tree. The steps of C4.5 decision tree is as followed.

The total information entropy of the training data is calculated by Eq. (1):

$$H(T) = -\sum_{i=1}^{2} p_i \log_2 p_i \quad (1)$$

where $p_1$ indicates the proportion of ambient data group in T, $p_2$ indicates the proportion of disturbance data group in T, and H(T) is the uncertainty of the group state. This information plays a role in selecting the optimal partitioning feature in the decision tree.

It is assumed that feature a is selected to divide T, and the contiguous feature a is discretized by dichotomy. There are m different values in feature a, and these values are sorted from small to large, $\{a^1, a^2, \ldots, a^m\}$. Using the median point $$\frac{a^i + a^{i+1}}{2}$$

of the interval [$a^i+a^{i+1}$) is as the partition point, a set of m−1 partition point can be obtained.

$$Q = \left\{ q_i = \frac{a^i + a^{i+1}}{2} \mid 1 \le i \le m-1 \right\} \quad (2)$$

For each diving point $q_i$, T is divided into subsets $T_q^-$ and $T_q^+$. $T_q^-$ contains the groups where $a_i \le q_i$, and $T_q^+$ contains the groups where $a_i > q_i$. The information gain of $q_i$ is computed according to (3):

$$G(T, a, q_i) = H(T) - \frac{|T_{q_i}^-|}{|T|} H(T_{q_i}^-) - \frac{|T_{q_i}^+|}{|T|} H(T_{q_i}^+) \quad (3)$$

where |T| represents the number of groups, $|T_{q_i}^-|/|T|$ is the weight of the groups in which $a_i \le q_i$, and $|T_{q_i}^+|/|T|$ represents the weight of the groups where $a_i > q_i$. The greater the information gain is, the better the effect of partition point.

The maximum value is selected from the information gain of all the partition points as the information gain of the feature a. Because the information gain criterion has a preference on features with more values, the gain ratio is used to select the optimal feature. It is defined as follows:

$$g(T, a, q_i) = \frac{G(T, a, q_i)}{IV(a)} \quad (4)$$

$$IV(a) = -\sum_{\beta \in \{-,+\}} \frac{|T_{q_i}^\beta|}{|T|} \log_2 \frac{|T_{q_i}^\beta|}{|T|} \quad (5)$$

where IV(a) is the intrinsic value.

Therefore, the partition point $q_a$ with the largest gain ratio $g(T, a, q_a)$ is selected as the branch node of the decision tree.

Figure 3:
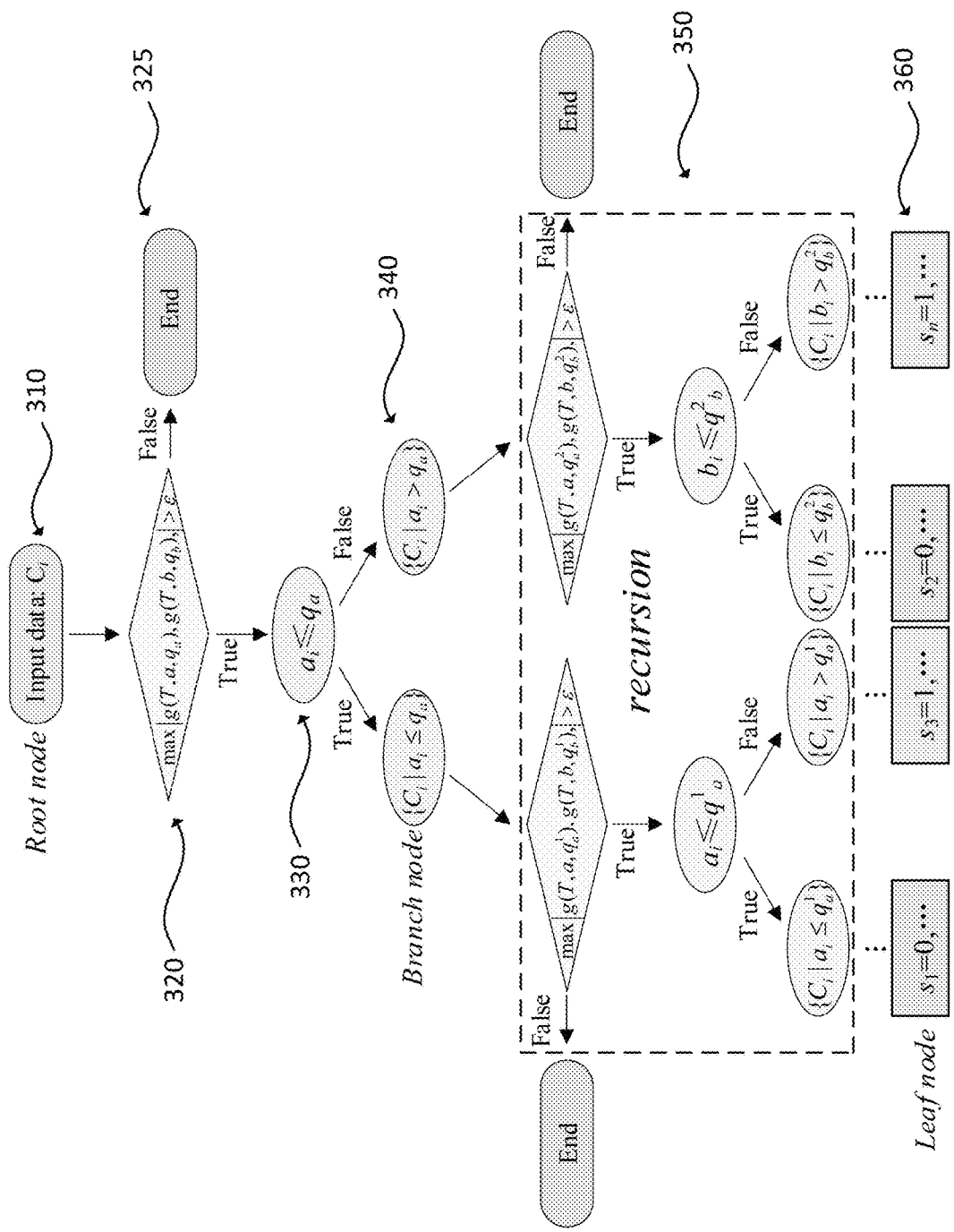
FIG. 3 shows exemplary nodes of a decision tree according to an example embodiment.

FIG. 3 shows exemplary nodes of a decision tree according to an example embodiment. The decision tree depth d and the threshold ε of the information gain ratio are set first, which determines the accuracy of the classification. d indicates the number of recursive calculations. And the end condition of the decision tree is as follows: if the maximum number of calculations exceeds d, the partition is stopped; if the information gain ratio of each feature is less than ε, it is not divided. Meanwhile, if all the states in the division result are consistent, the division is stopped.

In step 310, all the groups $C_i$ are provided as inputs. In step 320, the gain ratios of the features (a, b) are calculated, and the largest one is selected for comparison with the threshold ε. If the gain ratio is less than ε, the tree is a single node tree (325). It is considered that the state of all the groups is the state of the majority. If not, it is assumed that $g(T, a, q_a)$ is the largest one. In step 330, $a_i$ is compared with $q_a$, and in step 340, all groups $C_i$ with $a_i \le q_a$ are placed in one class, and the remaining are placed in another class. This node is called the branch node. The above steps are then repeated recursively (350) until all groups in one class are in the same state, or the maximum gain ratio is less than ε, as illustrated by the dotted box in FIG. 3. The last node is called leaf node (360) and this completes the decision tree process.

A decision function is used to illustrate that the test data T' contains which kind of data. The test data is equally divided into groups $C'_i$, and each group is input into the decision tree to determine its corresponding state $s_i$. The decision function is as follows.

$$f(T') = \begin{cases} 0, & s_i = 0, i = 1, 2, \ldots, \lceil |T'|/k \rceil \\ 1, & s_i = 1, i = 1, 2, \ldots, \lceil |T'|/k \rceil \\ 2, & s_i \ne s_j, \forall i \ne j, i, j = 1, 2, \ldots, \lceil |T'|/k \rceil \end{cases} \quad (6)$$

Eq. (6) shows that if all $s_i=0$, the function result is 0. It means the test data is all ambient data, and the missing data can be recovered by the ambient data recovery method. If all $s_i=1$, the function result is 1. It means the test data is all disturbance data, and the missing data can be recovered by the disturbance data recovery method. If $s_i \ne s_j$, the function result is 2. It means both ambient and disturbance data are included in the test set, and the missing data can be recovered by the corresponding method.

When data loss occurs in the PMU measurement, the identification algorithm only uses the existing data to do the identification. The impact of the missing data on the identification results are shown in 6.1.1 and 6.2.2, respectively.

3.2. Algorithm Parameter Setting

At the beginning of the algorithm, a threshold ε of the information gain ratio and the depth of the decision tree d must be set. FIG. 4A shows exemplary results of optimal parameters, in particular, shows the relationship between E and accuracy and FIG. 4B shows exemplary results of optimal parameters, in particular, shows the relationship between d and accuracy. The optimal parameters can be selected by traversing, as shown in FIG. 4A and FIG. 4B.

It can be seen from FIG. 4A that when s gradually increases to 0.006, the accuracy of the test data reaches the maximum and remains constant. Therefore, the threshold must be set to 0.006. FIG. 4B illustrates that when the depth of the decision tree is 5, the accuracy of the test data is the highest. When the depth is greater than 5, the structure of the decision tree is too complicated and leads to over-fitting, which in turn lowers the test data accuracy.

4. Recovery Method for Ambient Data 4.1. Priority Allocation Strategy

When a single data point is lost, there is no need to consider the recovery order. If there is a large amount of missing data, the existing method requires a large amount of calculation, and the error is large. To restore the original information as much as possible, this disclosure describes a priority allocation strategy based on the dynamic change of interpolation interval, which can effectively improve the recovery accuracy.

Figure 5:
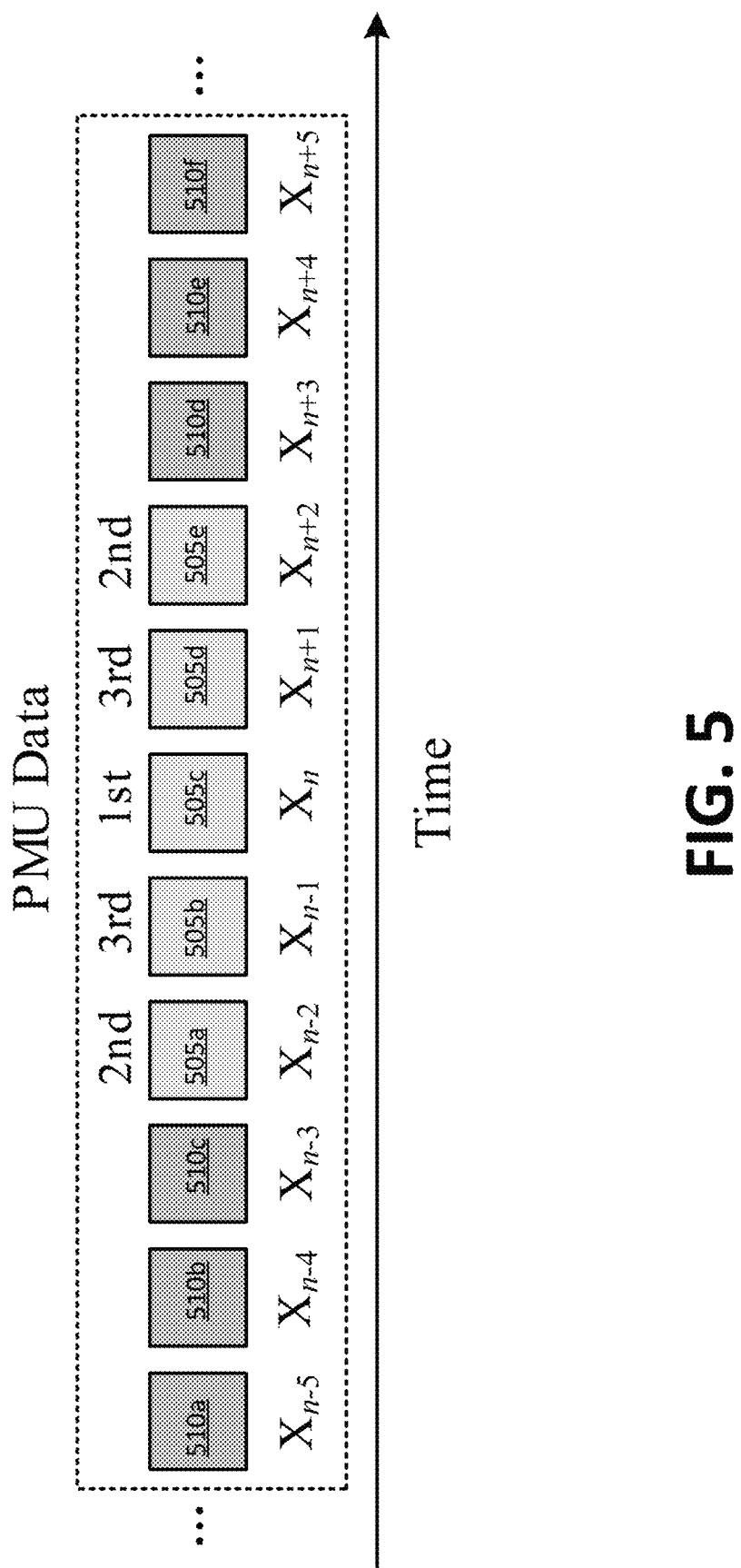
FIG. 5 shows an exemplary diagram displaying an odd number of data points missing.
Figure 6:
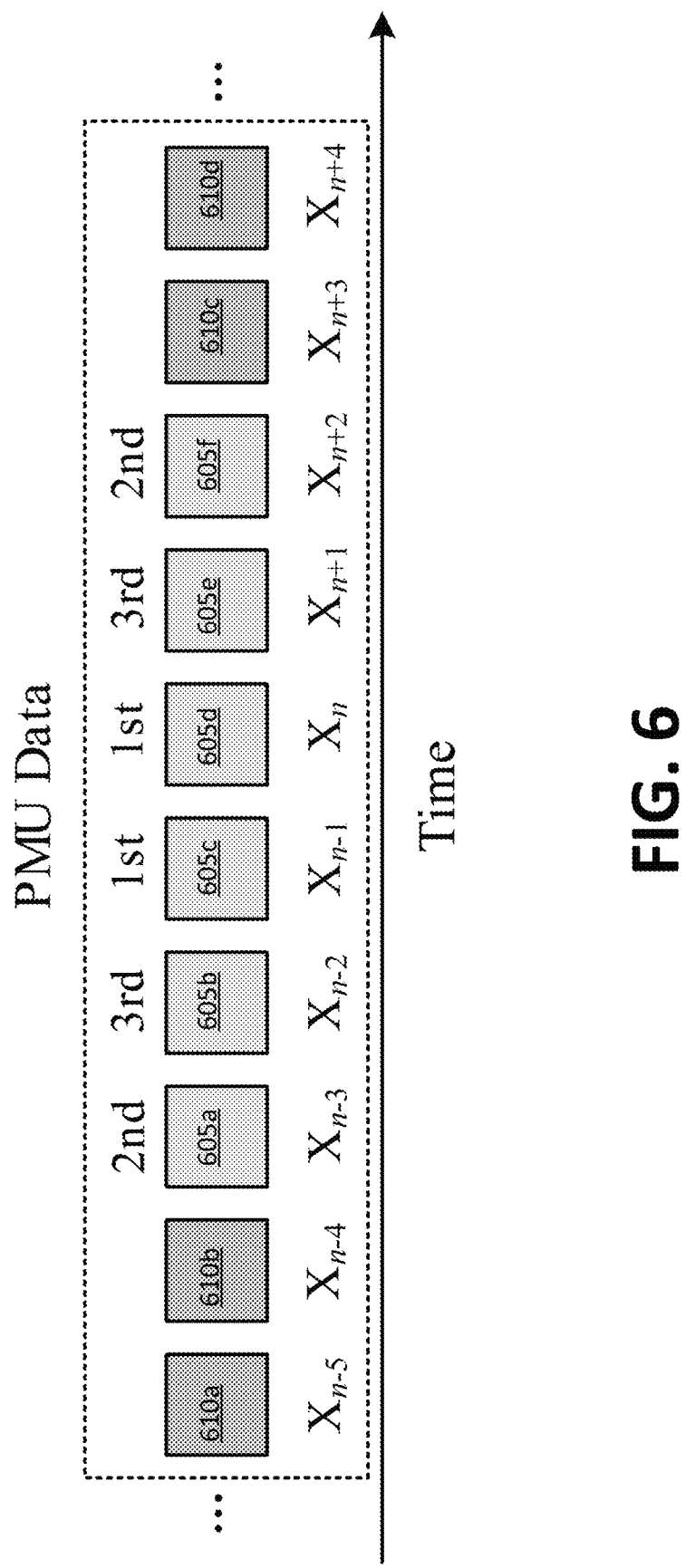
FIG. 6 shows an exemplary diagram displaying an even number of data points missing.

The contiguous data loss type is taken as an example here. According to the parity of missing data, the strategy should be discussed in two cases, e.g., an odd number of data points missing and an even number of data points missing. FIG. 5 shows a diagram displaying an odd number of data points missing. FIG. 6 shows a diagram displaying an even number of data points missing. The square represents the PMU measurement over a period of time. The square (505a, 505b, 505c, 505d and 505e in FIGS. 5 and 605a, 605b, 605c, 605d, 605e and 605f in FIG. 6) is missing data, and the square (510a, 510b, 510c, 510d, 510e and 510f in FIGS. 5 and 610a, 610b, 610c and 610d in FIG. 6) is known data.

All PMU data is taken as input. The number of missing data points is set to E, and the interpolation interval is set to Z. When E is odd, $$Z_1 = \frac{E+1}{2}.$$

$X_n$ is to be recovered in the first stage using eight data points $(X_{n-4Z_1}, X_{n-3Z_1}, X_{n-2Z_1}, X_{n-Z_1}, X_{n+Z_1}, X_{n+2Z_1}, X_{n+3Z_1}, X_{n+4Z_1})$ with the interval $Z_1$, where $$n = \left\lceil \frac{E}{2} \right\rceil.$$

Next, $X_{n-2}$, and $X_{n+2}$ are recovered in the second stage using the existing data between which the interval is $Z_2$, and the data recovered in the first stage $(X_n)$, where $Z_2=Z_1-1$. Finally, $X_{n-1}$ and $X_{n+1}$ are recovered in the third stage, using the existing data between which the interval is $Z_3$, and the data recovered in the first two stages $(X_{n-2}, X_n, X_{n+2})$, where $Z_3=Z_2-1$.

When E is even, $$Z_1 = \frac{E+2}{2}.$$

Both $X_n$ and $X_{n-1}$ are recovered in the first stage using eight data points $(X_{n-4Z_1}, X_{n-3Z_1}, X_{n-2Z_1}, X_{n-Z_1}, X_{n+Z_1}, X_{n+2Z_1}, X_{n+3Z_1}, X_{n+4Z_1}$ and $X_{n-1-4Z_1}, X_{n-1-3Z_1}, X_{n-1-2Z_1}, X_{n-1-Z_1}, X_{n-1+Z_1}, X_{n-1+2Z_1}, X_{n-1+3Z_1})$ with the interval $Z_1$, respectively. $X_{n-3}$ and $X_{n+2}$ are recovered in the second stage using the existing data between which the interval is $Z_2$, and the data recovered in the first stage $(X_{n-1}, X_n)$, where $Z_2=Z_1-1$. In the third stage, $X_{n-2}$ and $X_{n+1}$ are recovered using the existing data between which the interval is $Z_3$, and the data recovered in the first two stages $(X_{n-3}, X_{n-1}, X_n, X_{n+2})$, where $Z_3=Z_2-1$.

4.2. Data Recovery Based on Improved Cubic Spline Interpolation

Based on the priority allocation strategy, this disclosure uses the cubic spline interpolation method to recover missing data. The cubic spline interpolation can ensure the first and second derivatives of the function are contiguous. Meanwhile, the curve obtained by the cubic spline interpolation has good smoothness and strong linear approximation ability which can effectively represent the data change and avoid the Runge phenomenon caused by the high-order polynomial. However, other interpolation functions like Lagrange, Newton or Piecewise interpolation do not have such a property. In addition, the effect of the interpolation depends not only on the endpoint data of the missing interval, but also on data points whose interval is equidistant from the missing data. Based on the priority allocation strategy, the periodic signal in the time series is not impaired. This is because the interval between the known points and the missing points is equal.

The cubic spline interpolation function is obtained from known data, and the missing data can be recovered because the function has a good fit with the known data. The function construction method is as follows.

A function $X=f(t)$ of voltage amplitude $X_i$ and time $t_i$ is constructed, where $t_i \in [t_a, t_b]$ and $i=0, 1, \ldots, n$.

If $S(t)$ satisfies: 1) On each subinterval $[t_k, t_{k+1}]$ ($k=1, 2, \ldots, n-1$), $S(t)$ is a polynomial no more than three times, and $S(t_i)=X_i$. 2) $S(t)$, $S'(t)$, and $S''(t)$ are contiguous on interval $[t_a, t_b]$. Therefore, $S(t)$ is the cubic spline interpolation function of $f(t)$ on node $t_0, t_1, \ldots, x_n$.

Set $M_i=S''(t_i)$, and the first derivative at the boundary of each interval of the cubic spline interpolation function is smoothed while the second derivative is contiguous. Therefore, in interval $[t_i, t_{i+1}]$, the second derivative of $S(t)$ is expressed as:

$$S''(t) = M_i \frac{t_{i+1}-t}{h_i} + M_{i+1} \frac{t-t_i}{h_i} \qquad (7)$$

where $h_i = t_{i+1}-t_i$. Two consecutive integrations are then performed on formula (7), obtaining:

$$S'(t) = -M_i \frac{(t_{i+1}-t)^2}{2h_i} + M_{i+1} \frac{(t-t_i)^2}{2h_i} + \frac{X_{i+1}-X_i}{h_i} - \frac{M_{i+1}-M_i}{6} h_i \qquad (8)$$

$$S(t) = M_i \frac{(t_{i+1}-t)^3}{6h_i} + M_{i+1} \frac{(t-t_i)^3}{6h_i} + \left(\frac{X_i}{h_i} - \frac{M_i}{6} h_i\right)(t_{i+1}-t) + \left(\frac{X_{i+1}}{h_i} - \frac{M_{i+1}}{6} h_i\right)(t-t_i) \qquad (9)$$

Using continuity $S'(t_{i-})=S'(t_{i+})$, Eq. (10) is as follows:

$$\mu_i M_{i-1} + 2M_i + \lambda_i M_i = d_i \ (i=1,2,\ldots,n-1) \qquad (10)$$

where, $$\begin{cases} \beta_i = \frac{h_{i-1}}{h_i + h_{i-1}}, \lambda_i = 1 - \beta_i \\ d_i = 6\left(\frac{X_{i+1}-X_i}{h_i} - \frac{X_i-X_{i-1}}{h_{i-1}}\right)(h_1+h_{i-1})^{-1} \end{cases} \qquad (11)$$

According to standard boundary conditions $S'(t_0)=X'_0$, $S'(t_n)=X'_n$, Eq. (10) can be written in the following matrix form:

$$\begin{bmatrix} 2 & 1 & & & & \\ \beta_1 & 2 & \lambda_1 & & & \\ & \beta_2 & 2 & \lambda_2 & & \\ & & \ddots & \ddots & \ddots & \\ & & & \beta_{n-1} & 2 & \lambda_{n-1} \\ & & & & 1 & 2 \end{bmatrix} \begin{bmatrix} M_0 \\ M_1 \\ M_2 \\ \vdots \\ M_{n-1} \\ M_n \end{bmatrix} = \begin{bmatrix} d_0 \\ d_1 \\ d_2 \\ \vdots \\ d_{n-1} \\ d_n \end{bmatrix} \qquad (12)$$

The coefficient matrix in Eq. (12) is strictly diagonally dominant and has a unique solution.

The standard cubic spline interpolation function is a function of the boundary condition. According to the ambient data characteristics, in order to make the spline curve flatter, the minimum difference is required to be minimum.

In the interval $[t_{i-1}, t_i]$ ($i=1, 2, \ldots, n$), the extreme values of $S(t)$ are $S_i$ max and $S_i$ min. Thus, the extreme difference of $S(t)$ in the interval $[t_a, t_b]$ is:

$$Q = \max_{1 \le i \le n}(S_i \max) - \min_{1 \le i \le n}(S_i \min) \qquad (13)$$

Assuming $S'(t_0)=X'_0$, $S'(t_n)=X'_n$ is unknown, the extreme difference is a function of $M_0$ and $M_n$.

$$\min Q = \max_{1 \le i \le n}(S_i \max) - \min_{1 \le i \le n}(S_i \min) \qquad (14)$$

Function (14) is an unconstrained nonlinear programming problem for $M_0$ and $M_n$. The objective function contains extremum operations, so it can be calculated by direct method.

In summary, the ambient data recovery method steps are as follows: 1) Data loss is analyzed and the type of data loss is determined. 2) The data recovery is determined according to the priority allocation strategy. 3) An improved cubic spline interpolation function is found that satisfies the extreme value difference constraint and the missing data is recovered. The number of optimal interpolation points can be provided in these techniques.

5. Recovery Method for Disturbance Data

In addition to the ambient data, most of the other data in the power system is nonlinear and disturbed. It is difficult for the interpolation algorithm to recover disturbance data. Therefore, this disclosure adopts the method based on singular value decomposition to extract useful information from short-term, noise measurement, then recovers the missing data.

5.1. Characteristic Component Decomposition of Phasor

In this disclosure, the PMU measurement phasor is decomposed, and characterized as including characteristic components of different components. Taking the measurement information under system oscillation as an example, it can be characterized by an amplitude modulation signal containing a plurality of modulation components. The signal expression is as follows:

$$x(t) = \sqrt{2}\sum_{i=1}^{\frac{k-1}{2}} 2X_i\cos(2\pi f_i t + \varphi_i)\cos(2\pi f_0 t + \varphi_0) + \sqrt{2} X_0\cos(2\pi f_0 t + \varphi_0) + n(t) \quad (15)$$

where $X_0$ is fundamental phasor magnitude, $f_0$ is power frequency, $\varphi_0$ is the initial phase angle, $2X_i$ is amplitude modulation depth of each modulation component, $f_i$ is the frequency of response modulation, $\varphi_i$ is the phase angle of response modulation, and $n(t)$ is the noise.

By trigonometric function transformation, formula (15) can be written as follows:

$$x(t) = \sqrt{2}\left[X_0 + \sum_{i=1}^{\frac{k-1}{2}} 2X_i\cos(2\pi f_i t + \varphi_i)\right]\cos(2\pi f_0 t + \varphi_0) + n(t) \quad (16)$$

$$= \sqrt{2} X_0\cos(2\pi f_0 t + \varphi_0) + \sqrt{2}\sum_{i=1}^{\frac{k-1}{2}} X_i\cos[2\pi(f_0 + f_i)t + (\varphi_0 + \varphi_i)] + \sqrt{2}\sum_{i=1}^{\frac{k-1}{2}} X_i\cos[2\pi(f_0 - f_i)t + (\varphi_0 - \varphi_i)] + n(t)$$

It can be seen that the amplitude modulated signal containing different modulation components can be equivalent to that being superposed by signals of different frequencies. Its phasor form is:

$$\dot{X} = X_0 e^{j(2\pi f_0 t + \varphi_0)} + \sum_{i=1}^{\frac{k-1}{2}} X_i e^{j[2\pi(f_0+f_i)t+(\varphi_0+\varphi_i)]} + \quad (17)$$

$$\sum_{i=1}^{\frac{k-1}{2}} X_i e^{j[2\pi(f_0-f_i)t+(\varphi_0-\varphi_i)]} = \dot{X}_0 + \sum_{i=1}^{\frac{k-1}{2}} (\dot{X}_i + \dot{X}'_i)$$

where $\dot{X}_i$ and $\dot{X}'_i$ are the phasors which correspond to the last two terms of the polynomial.

Figure 7:
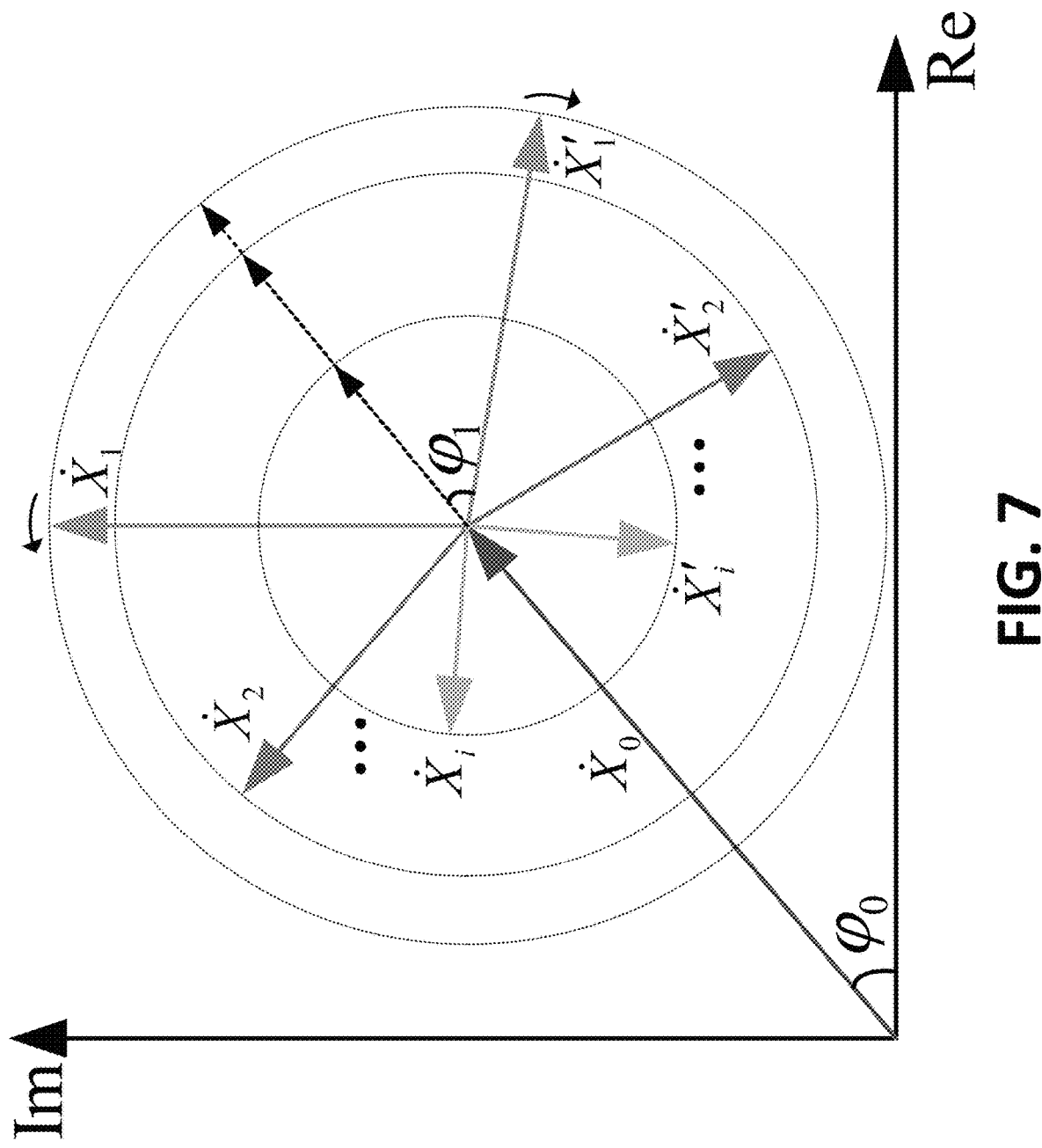
FIG. 7 shows an example schematic diagram of signal component phasor during amplitude modulation.

FIG. 7 shows an example schematic diagram of signal component phasor during amplitude modulation. In FIG. 7, the horizontal axis and the vertical axis represent the real part and the imaginary part. The coordinate axes and the fundamental phasor $\dot{X}_0$ rotate synchronously with the same angular velocity $2\pi f_0$. The remaining $$\frac{k-1}{2}$$

pairs of phasors $\dot{X}_i$ and $\dot{X}'_i$ rotate symmetrically about $\dot{X}_0$ with the angular velocity $2\pi f_i$. Therefore, the phasor amplitude $|\dot{X}|$ can be equivalent to the superposition of the projection of each frequency signal on $\dot{X}_0$, as shown in formula (18).

$$|\dot{X}| = X_0 + \sum_{i=1}^{\frac{k-1}{2}} X_i\cos(2\pi f_i t + \varphi_i) + \sum_{i=1}^{\frac{k-1}{2}} X'_i\cos(2\pi f_i t + \varphi_i) = X_0 + 2\sum_{i=1}^{\frac{k-1}{2}} X_i\cos(2\pi f_i t + \varphi_i) \quad (18)$$

The amplitude is analyzed as an object, assuming that the PMU measures the phasor upload frequency as $f_N$, and the time window is t.

Figure 8:
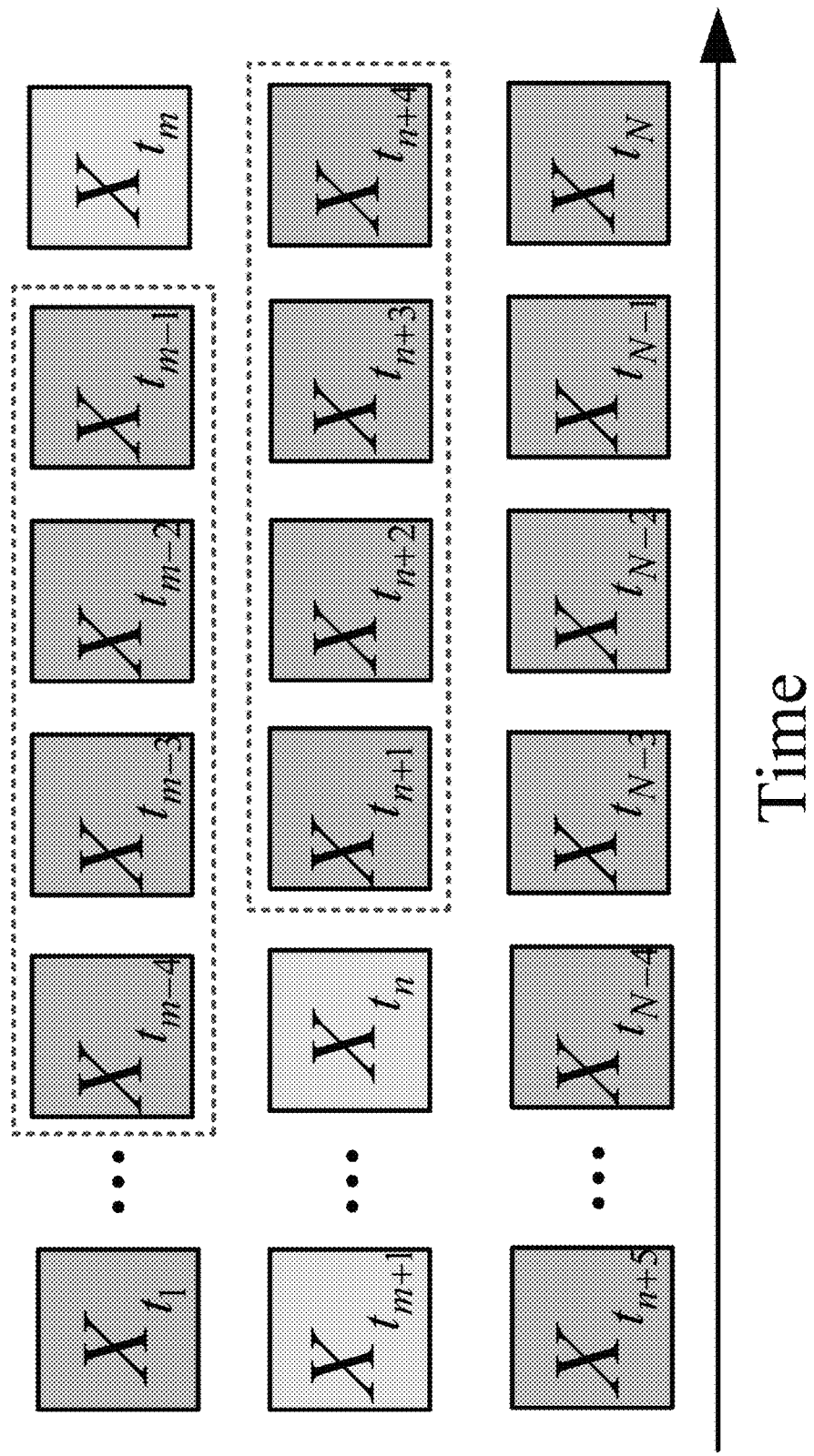
FIG. 8 shows an example schematic diagram of PMU measurement data.

FIG. 8 shows an example schematic diagram of PMU measurement data. The data can be $X=[X_{t_1}, X_{t_2}, \ldots, X_{t_{N-1}}, X_{t_N}]$. In FIG. 8, $$X_{t_1} = X_0 + 2\sum_{i=1}^{\frac{k-1}{2}} X_i\cos(2\pi f_i t_1 + \varphi_i).$$

The data number is $N=f_N \cdot T$, which is divided into three categories: training data $X_{train}=[X_{t_1}, X_{t_2}, \ldots, X_{t_{m-1}}, X_{t_{n+1}}, X_{t_{n+2}}, \ldots, X_{t_N}]$, verification data $X_{test}=[X_{t_{m-4}}, X_{t_{m-3}}, X_{t_{m-2}}, X_{t_{m-1}}, X_{t_{n+1}}, X_{t_{n+2}}, X_{t_{n+3}}, X_{t_{n+4}}]$, and the missing data $X_{lost}=[X_{t_m}, X_{t_{m+1}}, \ldots, X_{t_{n-1}}, X_{t_n}]$. Among them, the training and verification data are known data, which are used to decompose the characteristic components of the measurement data and verify the accuracy of the recovered data. The initial value of the missing data is zero, which is recovered by the decomposed characteristic components.

According to the Takens theorem, the one-dimensional time series X is mapped to the trajectory matrix Y of the high-dimensional space.

$$X = [X_{t_1}, X_{t_2}, \ldots, X_{t_N}] \rightarrow Y = [Y_1, Y_2, \ldots Y_K] \quad (19)$$

$$Y_z = [X_z, X_{z+1}, \ldots, X_{z+L-1}]^T, z = 1, 2, \ldots, K$$

-continued $$Y = \begin{bmatrix} X_{t_1} & X_{t_2} & \cdots & X_{t_m} & \cdots & X_{t_n} & \cdots & X_{t_K} \\ X_{t_2} & X_{t_3} & \cdots & X_{t_{m+1}} & \cdots & X_{t_{n+1}} & \cdots & X_{t_{K+1}} \\ \vdots & \vdots & \vdots & \vdots & \vdots & \vdots & \vdots & \vdots \\ X_{t_L} & X_{t_{L+1}} & \cdots & X_{t_{m-1+L}} & \cdots & X_{t_{n-1+L}} & \cdots & X_{t_N} \end{bmatrix} \quad (20)$$

where the matrix Y is a Hankel matrix, which means that Y has equal elements $Y_{ij}$ on the anti-diagonals i+j=const. Subscript L is the number of matrix rows, which can measure the dimension of the matrix, and K is the number of matrix columns, K=N−L+1.

The covariance matrix of Y is $S=YY^T$. The eigenvalue decomposition of the matrix S is then performed to determine the characteristics of each component. It is denoted by the eigenvalues ($\lambda_1 \geq \ldots \geq \lambda_L$) of S taken in the decreasing order of magnitude, and $U_1, U_2, \ldots, U_L$ is the orthonormal system of the eigenvectors of the matrix corresponding to $\lambda$. Additionally, $V_i = Y^T U_i / \sqrt{\lambda_i}$, and i=1, 2, ..., L. Next, d is set as the subscript corresponding to the largest eigenvalue, that is, the rank of the matrix Y.

$$d = \text{rank } Y = \max\{i | s.t. \lambda_i > 0\} \quad (21)$$

Thus, the trajectory matrix Y can be written as:

$$Y = Y_1 + Y_2 + \ldots + Y_{k-1} + Y_k + Y_{k+1} + \ldots + Y_d \quad (22)$$

where $Y_i = \sqrt{\lambda_i} U_i V_i^T$, i=1, 2, ..., d are matrices with rank 1, which are called elementary matrices. The collection ($\sqrt{\lambda_i}$, $U_i$, $V_i$) is named the ith eigentriple, and $\{\sqrt{\lambda_i}\}$ are the singular values, providing the singular spectrum of Y. The $\sqrt{\lambda_i} V_i$ are called vectors of principal components, which represent the phasors in FIG. 7. For example, $Y_1$ corresponds to the fundamental phasor. $Y_2$ and $Y_3$ correspond to $\dot{X}_1$ and $\dot{X}'_1$, $Y_{k-1}$ and $Y_k$ correspond to $$\dot{X}_{\frac{k-1}{2}}$$

and $$\dot{X}'_{\frac{k-1}{2}},$$

and $Y_{k+1}$, $Y_{k+2}$, ..., $Y_d$ correspond to the insignificant components such as noise.

Thus, the choice of the number of characteristic components k can directly affect the sequence reconstruction. If k is too large, it will contain non-meaningful components such as noise, which can easily cause the inundation of the missing data. If it is too small, it will not be enough to include all the effective characteristics, resulting in low data recovery accuracy.

5.2. Optimal Number of Characteristic Components

Most existing methods use the technique of estimating eigenvalues to solve the characteristic component number, and the robustness of these techniques is poor. As the PMU data has a high signal-to-noise ratio and the noise model is complex, this disclosure selects the Gershgorin disk method to obtain the optimal characteristic component number k, which is robust.

The Gershgorin disk method estimates the eigenvalue position of the matrix S using the disk center $o_i$ and the disk radius $r_i$. Each center $o_i$ is determined by the main diagonal element $S_{Tii}$ of $S_T$ after unitary transformation, and the radius $r_i$ is:

$$r_i = \sum_{j=1, i \neq j}^{L} |S_{Tij}|, i = 1, 2, \ldots, L \quad (23)$$

Figure 9:
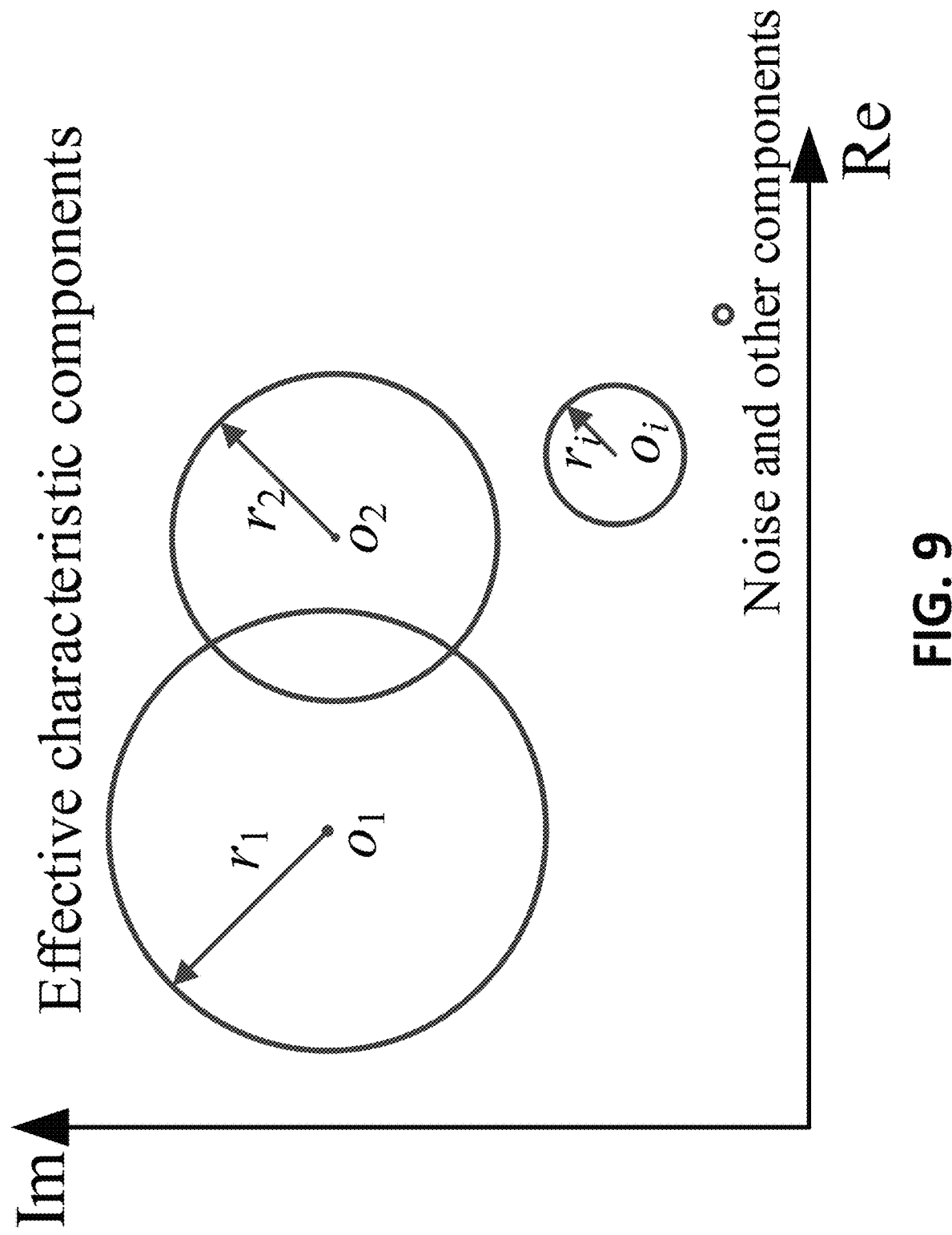
FIG. 9 shows an example schematic diagram of Gershgorin disk method.

The eigenvalues of the matrix S are contained in each disk, and the matrix S must have d disks that are not included in each other. FIG. 9 shows an example schematic diagram of Gershgorin disk method. In FIG. 9, the size of each disk represents the specific gravity of each characteristic component. The intersection of the Disk $O_1$ and Disk $O_2$ has only two eigenvalues. If a characteristic component represents noise, the disk will infinitely approach zero. Disk $O_1$ is the proportion of the fundamental amplitude $|\dot{X}_0|$ in the phasor magnitude $|\dot{X}|$ in FIG. 7 and so on. Disks $o_{k+1}, o_{k+2}, \ldots, o_d$ are the proportion of meaningless components such as noise.

The optimal characteristic component number can therefore be judged by the number of non-zero radius, and the component number criterion is as follows:

$$GDE(j) = r_j - \frac{P}{d-1} \sum_{i=1}^{d-1} r_i > 0 \quad (24)$$

where the adjustment factor P is from 0 to 1, $j \in [1, d-2]$. When GDE(j)<0 for the first time, set $j=j_0$. Thus, the optimal component number k is $j_0 - 1$.

5.3. Original Sequence Reconstruction and Data Recovery

The original sequence can be reconstructed by k characteristic components after filtering the noise. Then:

$$Y \approx Y_1 + Y_2 + \ldots + Y_k \quad (25)$$

Using the diagonal average criterion, each of the above matrices of formula (25) are converted into a new series of length N. Let $X^*_{ij}$ be the element of the ith row and jth column of the reconstruction matrix $Y_i$. Then, the qth data in the reconstructed sequence X(1) is the average of all $X(1)_q$, satisfying i+j=q+1. Set $L^*=\min(L, K)$, $K^*=\max(L, K)$, and $$X^*_{ij} = \begin{cases} X_{ij}, & L < K \\ X_{ji}, & L \geq K \end{cases} \quad (26)$$

The reconstruction sequence is as follows:

$$X(1)_q = \begin{cases} \frac{1}{q} \sum_{p=1}^{q} X^*_{p, q-p+1}, & 1 \leq q < L^* \\ \frac{1}{L^*} \sum_{p=1}^{L^*} X^*_{p, q-p+1}, & L^* \leq q \leq K^* \\ \frac{1}{N-q+1} \sum_{p=q-K^*+1}^{N-q+1} X^*_{p, q-p+1}, & K^* < q \leq N \end{cases} \quad (27)$$

The above steps reconstruct the original sequence X decomposition into the sum X(1) of k sequences [$X^{(1)}$, $X^{(2)}$, ..., $X^{(k)}$]. Where:

$$X^{(k)} = [X_{t_1}^{(k)}, X_{t_2}^{(k)}, \ldots, X_{t_{N-1}}^{(k)}, X_{t_N}^{(k)}] \quad (28)$$

$$X(1) \leftrightarrow \begin{bmatrix} X_{t_1}^{(1)} & X_{t_2}^{(1)} & \cdots & X_{t_{N-1}}^{(1)} & X_{t_N}^{(1)} \\ X_{t_1}^{(2)} & X_{t_2}^{(2)} & \cdots & X_{t_{N-1}}^{(2)} & X_{t_N}^{(2)} \\ \vdots & \vdots & \vdots & \vdots & \vdots \\ X_{t_1}^{(k)} & X_{t_2}^{(k)} & \cdots & X_{t_{N-1}}^{(k)} & X_{t_N}^{(k)} \end{bmatrix} \quad (29)$$

It can be seen from formula (29) that $X^{(1)}$ is the fundamental phasor magnitude $|\dot{X}_0|$, $X^{(2)}$ is $|\dot{X}_1| \cos(2\pi f_1 t + \varphi_1)$, $X^{(3)}$ is $|\dot{X}'_1| \cos(2\pi f_1 t + \varphi_1)$, and $X^{(k)}$ is $$|\dot{X}'_{\frac{k-1}{2}}| \cos\left(2\pi f_{\frac{k-1}{2}} t + \varphi_{\frac{k-1}{2}}\right).$$

Therefore, the missing data $X_{lost}$ can be replaced by the corresponding position value of the reconstructed sequence $X(1)$. If the verification data meets the threshold requirement at this time, then:

$$\max |X(1)_{test} - X_{test}| < \lambda \quad (30)$$

where $\lambda$ is the artificially set error threshold. This shows that the missing data has been effectively recovered. Otherwise, according to the same parameters, the sequence $X(1)$ is constructed as a Hankel matrix, decomposed, and reconstructed until the verification data meets the threshold requirement. The missing data recovery result is the corresponding position value.

5.4. Algorithm Parameter Setting and Recovery Steps

Figure 10:
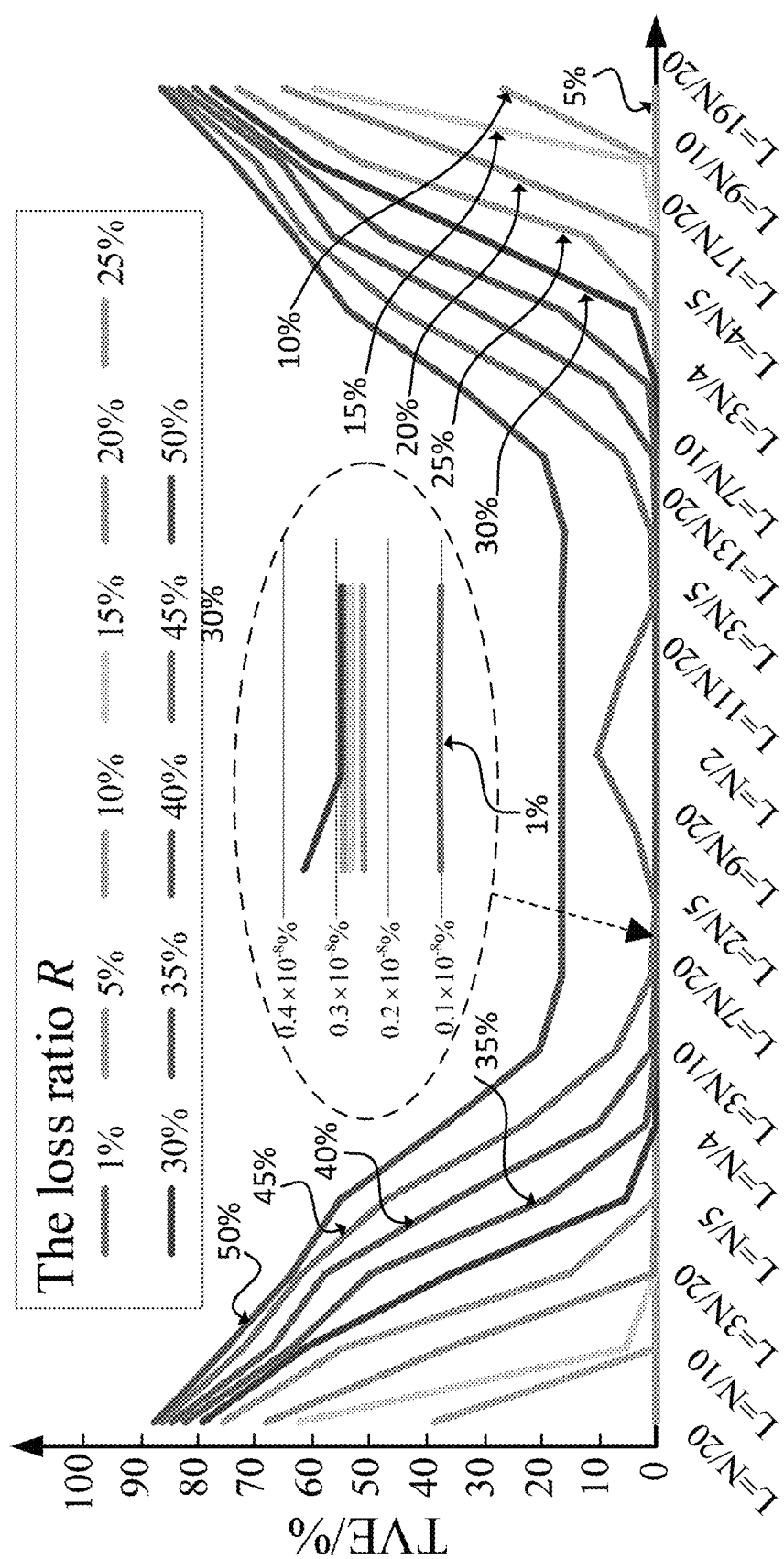
FIG. 10 shows exemplary relationships between loss ratio, matrix row number, and recovery accuracy.

The loss ratio R, the number of rows of the trajectory matrix L, and the optimal characteristic component number k, directly influence the generation of the reconstructed sequence, which in turn affects the accuracy of data recovery. The characteristic components number k is solved by Gershgorin disk method, and the remaining parameters are determined by simulation. Taking the mentioned amplitude modulation signal as an example, the optimal characteristic components number k is kept constant, the loss ratio R and the number of matrix rows L are changed, and the recovery precision is as shown in FIG. 10. As there is no relevant standard for measuring the dynamic performance of the PMU, the amplitude error and the phase angle error are used to measure the accuracy of the recovered data, and the results can be visually compared. This disclosure selects the total vector error (TVE) in the IEEE C37.118.1a-2014 standard to characterize recovery accuracy. The calculation formula is as follows:

$$TVE = \sqrt{\frac{(X'_r - X_r)^2 + (X'_i - X_i)^2}{X_r^2 + X_i^2}} \quad (31)$$

where $X_r$ and $X_i$ are the real and imaginary value of theoretical values of the input signal, $X'_r$ and $X'_i$ are the real and imaginary value of the estimates.

FIG. 10 shows exemplary relationships between loss ratio, matrix row number, and recovery accuracy. As seen in FIG. 10, as the loss ratio increases, the TVE gradually increases. The TVE is symmetrically distributed with respect to L=0.5 N. When the loss ratio is less than 10%, the maximum TVE is $10^{-8}$%, regardless of the value of L. When the loss ratio R is higher than 10% and lower than 40%, the value of L is between [0.4 N, 0.6 N], which can keep the TVE below 0.06%. When the loss ratio is higher than 45%, the error is large. To ensure the accuracy of data recovery and take the impact of data volume on the running time into account, this disclosure sets the loss ratio R to 30%, and the value of L is between [0.4 N, 0.6 N].

In summary, the steps of data recovery are as follows: 1) The amount of data N and the number of rows of the track matrix L, according to the actual data loss position, are determined and the optimal loss ratio R is 30%. 2) A trajectory matrix is constructed and singular value decomposition is performed to extract all the characteristic components. 3) To filter out the influence of components such as noise, Gershgorin disk method is combined to solve the optimal characteristic component number k. 4) The original sequence is reconstructed using the optimal characteristic component. 5) If the verification data meets the threshold requirement, the calculation stops. If not, the iteration is repeated according to the same parameters until the requirements are met.

5.5. Exemplary Embodiment

Figure 11:
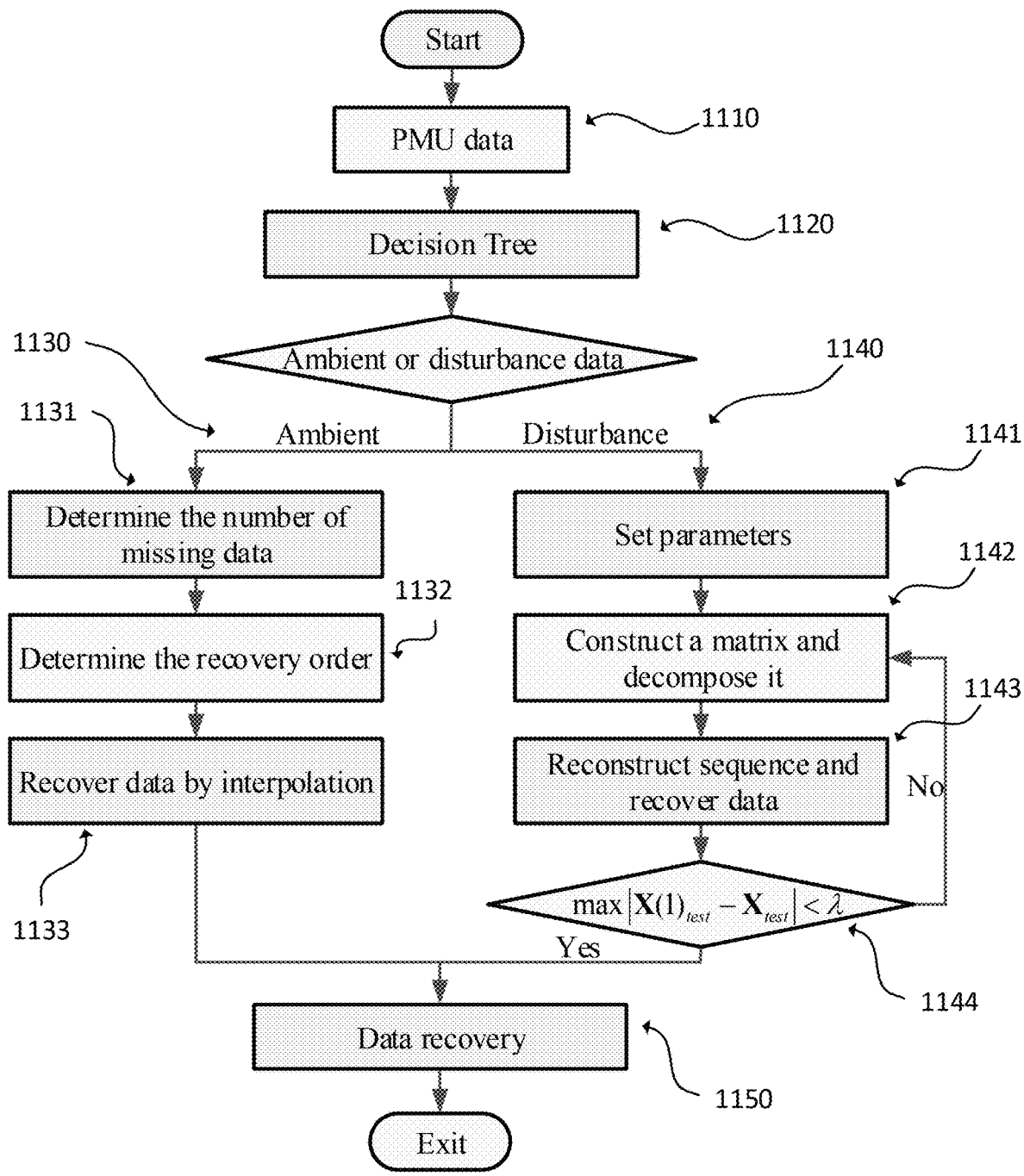
FIG. 11 shows a flow chart of PMU data identification and recovery algorithm according to an example embodiment.

FIG. 11 shows a flow chart of a PMU data identification and recovery algorithm according to an example embodiment. In this example embodiment, the identification and recovery algorithm can be implemented in a unit ("device") of a PMU. A PMU can include a microcontroller or microprocessor, an Analog-to-Digital Converter, a GPS, a local memory, and a communication interface.

In step 1110, the device can obtain phasor data (e.g., datasets $C_i$ each including a plurality of data points) from a power network. The phasor data can include a voltage signal and a current signal. For each signal, the device can obtain the amplitude, phase, frequency and ROCOF.

In step 1120, each dataset $C_i$ is divided into ambient data or disturbance data. For example, a binary classification model can be used to identify and separate ambient and disturbance data. In particular, a machine learning decision tree can be adopted to make this classification as follows.

In a first step, all the datasets $C_i$ can be provided as inputs to the decision tree. In a second step, the gain ratios of the features (a, b) are calculated, and the largest one is selected for comparison with a threshold $\varepsilon$. The gain ratio is defined as follows:

$$g(T, a, q_i) = \frac{G(T, a, q_i)}{IV(a)} \quad (4)$$

$$IV(a) = -\sum_{\beta \in \{-,+\}} \frac{|T_{q_i}^\beta|}{|T|} \log_2 \frac{|T_{q_i}^\beta|}{|T|} \quad (5)$$

where IV(a) is the intrinsic value; for each dataset $C_i$, $a_i$ is the variance, $b_i$ is the extreme value difference and $q_i$ is diving point; and $G(T, a, q_i)$ is information gain of $q_i$ which can be computed as follows:

$$G(T, a, q_i) = H(T) - \frac{|T_{q_i}^-|}{|T|} H(T_{q_i}^-) - \frac{|T_{q_i}^+|}{|T|} H(T_{q_i}^+) \quad (3)$$

where $|T|$ represents the number of groups, $|T_{q_i}^-|/|T|$ is the weight of the groups in which $a_i \leq q_i$, and $|T_{q_i}^+|/|T|$ represents the weight of the groups where $a_i > q_i$.

If the gain ratio is less than E, the tree is a single node tree and it is considered that the state of all the datasets is the state of the majority. If not, it is assumed that $g(T, a, q_a)$ is the largest one.

In a third step, $a_i$ is compared with $q_a$, and all datasets $C_i$ with $a_i \leq q_a$ are placed in one class (ambient data—to continue to step 1130), and the remaining are placed in another class (disturbance data—to continue to step 1140). The above steps are then repeated recursively until all datasets in one class are in the same state, or the maximum gain ratio is less than $\varepsilon$.

In steps 1130, the ambient data is restored by a recovery algorithm based on interpolation. In particular, in step 1131, the device determines the number E of data points missing, i.e., even or odd, and the device determines a type for the missing data, i.e., ambient data or disturbance data.

In step 1132, a data recovery technique is implemented according to the priority allocation strategy, i.e., a strategy the case when even data points are missing and a strategy for a case when odd data points are missing. In particular, the interpolation interval is set to Z. When E is odd, $$Z_1 = \frac{E+1}{2}.$$

$X_n$ is to be recovered in the first stage using eight data points $(X_{n-4Z_1}, X_{n-3Z_1}, X_{n-2Z_1}, X_{n-Z_1}, X_{n+Z_1}, X_{n+2Z_1}, X_{n+3Z_1}, X_{n+4Z_1})$ with the interval $Z_1$, where $$n = \left\lceil \frac{E}{2} \right\rceil.$$

Next, $X_{n-2}$ and $X_{n+2}$ are recovered in the second stage using the existing data between which the interval is $Z_2$, and the data recovered in the first stage ($X_n$), where $Z_2 = Z_1 - 1$. Finally, $X_{n-1}$ and $X_{n+1}$, are recovered in the third stage, using the existing data between which the interval is $Z_3$, and the data recovered in the first two stages ($X_{n-2}, X_n, X_{n+2}$), where $Z_3 = Z_2 - 1$.

When E is even, $$Z_1 = \frac{E+2}{2}.$$

Both $X_n$ and $X_{n-1}$ are recovered in the first stage using eight data points $(X_{n-4Z_1}, X_{n-3Z_1}, X_{n-2Z_1}, X_{n-Z_1}, X_{n+Z_1}, X_{n+2Z_1}, X_{n+3Z_1}, X_{n+4Z_1}$ and $X_{n-1-4Z_1}, X_{n-1-3Z_1}, X_{n-1-2Z_1}, X_{n-1-Z_1}, X_{n-1+Z_1}, X_{n-1+2Z_1}, X_{n-1+3Z_1})$ with the interval $Z_1$, respectively. $X_{n-3}$ and $X_{n+2}$ are recovered in the second stage using the existing data between which the interval is $Z_2$, and the data recovered in the first stage ($X_{n-1}, X_n$), where $Z_2 = Z_1 - 1$. In the third stage, $X_{n-2}$ and $X_{n+1}$ are recovered using the existing data between which the interval is $Z_3$, and the data recovered in the first two stages ($X_{n-3}, X_{n-1}, X_n, X_{n+2}$), where $Z_3 = Z_2 - 1$.

In step 1133, an improved cubic spline interpolation function is found that satisfies the extreme value difference constraint and the missing data is recovered. A function $X = f(t)$ of voltage amplitude $X_i$ and time $t_i$ is constructed, where $t_i \in [t_a, t_b]$ and $i = 0, 1, \ldots, n$. If S(t) satisfies: 1) On each subinterval $[t_k, t_{k+1}]$ ($k=1, 2, \ldots, n-1$), S(t) is a polynomial no more than three times, and $S(t_i) = X_i$. 2) S(t), S'(t), and S''(t) are contiguous on interval $[t_a, t_b]$. Therefore, S(t) is the cubic spline interpolation function of $f(t)$ on node $t_0, t_1, \ldots, x_n$. Here, the cubic spline interpolation function is denoted as:

$$S(t) = M_i \frac{(t_{i+1}-t)^3}{6h_i} + M_{i+1} \frac{(t-t_i)^3}{6h_i} + \left(\frac{X_i}{h_i} - \frac{M_i}{6} h_i\right)(t_{i+1}-t) + \left(\frac{X_{i+1}}{h_i} - \frac{M_{i+1}}{6} h_i\right)(t-t_i) \quad (9)$$

where $M_i = S''(t_i)$. The missing data is obtained using the cubic spline interpolation function in step 1150 using the known data.

In steps 1140, the disturbance data is restored by singular value decomposition. In particular, in step 1141, the amount of data N and the number of rows of the track matrix L, according to the actual data loss position, are determined and the optimal loss ratio R is 30%.

In step 1142, a trajectory matrix is constructed and singular value decomposition is performed to extract all the characteristic components. Specifically, the one-dimensional time series X is mapped to the trajectory matrix Y of the high-dimensional space to generate the trajectory matrix Y:

$$X = [X_{t_1}, X_{t_2}, \ldots, X_{t_N}] \rightarrow Y = [Y_1, Y_2, \ldots Y_K] \quad (19)$$

$$Y_z = [X_z, X_{z+1}, \ldots, X_{z+L-1}]^T, z = 1, 2, \ldots, K$$

$$Y = \begin{bmatrix} X_{t_1} & X_{t_2} & \cdots & X_{t_m} & \cdots & X_{t_n} & \cdots & X_{t_K} \\ X_{t_2} & X_{t_3} & \cdots & X_{t_{m+1}} & \cdots & X_{t_{n+1}} & \cdots & X_{t_{K+1}} \\ \vdots & \vdots & \vdots & \vdots & \vdots & \vdots & \vdots & \vdots \\ X_{t_L} & X_{t_{L+1}} & \cdots & X_{t_{m-1+L}} & \cdots & X_{t_{n-1+L}} & \cdots & X_{t_N} \end{bmatrix} \quad (20)$$

where the matrix Y is a Hankel matrix, which means that Y has equal elements $Y_{ij}$ on the anti-diagonals $i+j=\text{const}$. Subscript L is the number of matrix rows, which can measure the dimension of the matrix, and K is the number of matrix columns, $K = N - L + 1$.

The covariance matrix of Y is $S = YY^T$. The eigenvalue decomposition of the matrix S is then performed to determine the characteristics of each component. It is denoted by the eigenvalues ($\lambda_1 \geq \ldots \geq \lambda_L$) of S taken in the decreasing order of magnitude, and $U_1, U_2, \ldots, U_L$ is the orthonormal system of the eigenvectors of the matrix corresponding to $\lambda$. Additionally, $V_i = Y^T U_i / \lambda_i$, and $i = 1, 2, \ldots, L$. Next, d is set as the subscript corresponding to the largest eigenvalue, that is, the rank of the matrix Y.

$$d = \text{rank } Y = \max\{i | s.t. \ \lambda_i > 0\} \quad (21)$$

Thus, the trajectory matrix Y can be written as:

$$Y = Y_1 + Y_2 + \ldots + Y_{k-1} + Y_k + Y_{k+1} + \ldots + Y_d \quad (22)$$

where $Y_i = \sqrt{\lambda_i} U_i V_i^T$, $i = 1, 2, \ldots, d$ are matrices with rank 1, which are called elementary matrices. The collection ($\sqrt{\lambda_i}, U_i, V_i$) is named the ith eigentriple, and $\{\sqrt{\lambda_i}\}$ are the singular values, providing the singular spectrum of Y.

As an optional step, Gershgorin disk method can be performed to solve the optimal characteristic component number k. In particular, the optimal characteristic component number can be determined by the number of non-zero radius, and the component number criterion is as follows:

$$GDE(j) = r_j - \frac{P}{d-1} \sum_{i=1}^{d-1} r_i > 0 \quad (24)$$

where the adjustment factor P is from 0 to 1, $j \in [1, d-2]$, and $r_j$ and $r_i$ are different eigenvalues of matrix S. When GDE(j)<0 for the first time, set $j=j_0$. Thus, the optimal component number k is $j_0-1$.

In step 1143, the original sequence is reconstructed using the optimal characteristic component. Specifically, the original sequence X decomposition can be reconstructed into the sum X(1) of k sequences $[X^{(1)}, X^{(2)}, \ldots, X^{(k)}]$. Where:

$$X^{(k)} = [X_{t_1}^{(k)}, X_{t_2}^{(k)}, \ldots, X_{t_{N-1}}^{(k)}, X_{t_N}^{(k)}] \quad (28)$$

$$X(1) \leftrightarrow \begin{bmatrix} X_{t_1}^{(1)} & X_{t_2}^{(1)} & \cdots & X_{t_{N-1}}^{(1)} & X_{t_N}^{(1)} \\ X_{t_1}^{(2)} & X_{t_2}^{(2)} & \cdots & X_{t_{N-1}}^{(2)} & X_{t_N}^{(2)} \\ \vdots & \vdots & \vdots & \vdots & \vdots \\ X_{t_1}^{(k)} & X_{t_2}^{(k)} & \cdots & X_{t_{N-1}}^{(k)} & X_{t_N}^{(k)} \end{bmatrix}$$

Therefore, the missing data $X_{lost}$ can be replaced by the corresponding position value of the reconstructed sequence X(1).

In step 1144, if the verification data meets the below threshold requirement, the calculation stops.

$$\max |X(1)_{test} - X_{test}| < \lambda \quad (30)$$

If not, the iteration is repeated according to the same parameters until the requirements are met. Specifically, according to the same parameters, the sequence X(1) is constructed as a Hankel matrix, decomposed, and reconstructed until the verification data meets the threshold requirement.

In step 1150, the lost data will be recovered. The missing data is obtained using the cubic spline interpolation function using the known data.

The recovered data can improve the data quality of PMUs and can be used for further applications of power systems, such as power system dynamic monitoring, power system state estimation, parameter identification, closed-loop control, and so on.

6. Case Studies

The algorithm of this disclosure is tested by simulation. In addition, a laboratory test platform is also set up to verify the method by field recorded PMU data. The results are compared with Lagrange interpolation method and OLAP method.

6.1. Simulation 6.1.1. Simulation of Data Identification Method

A simulation signal with five inter-harmonics is input into the trained decision tree, and the identification result is recorded. The general expression of its signal is as follows:

$$x(t) = \sqrt{2} X_{m0} \cos(2\pi f_0 t + \varphi_0) + \sqrt{2} \sum_{i=1}^{5} X_{mi} \cos(2\pi f_i t + \varphi_i) \quad (32)$$

where $X_{mi}$ is the amplitude of a certain harmonic phasor, $f_i$ is its harmonic frequency, and $\varphi_i$ is its initial phase angle. Additionally, $X_{m1}=1.2$ V, $f_1=22$ Hz, $\varphi_1=0°$. $X_{m2}=1.5$ V, $f_2=68$ Hz, $\varphi_2=0°$. $X_{m3}=2.4$ V, $f_3=74$ Hz, $\varphi_3=0°$. $X_{m4}=2.8$ V, $f_4=84$ Hz, $\varphi_4=0°$, $X_{m5}=3.4$ V, $f_5=96$ Hz, and $\varphi_5=0°$.

Figure 12:
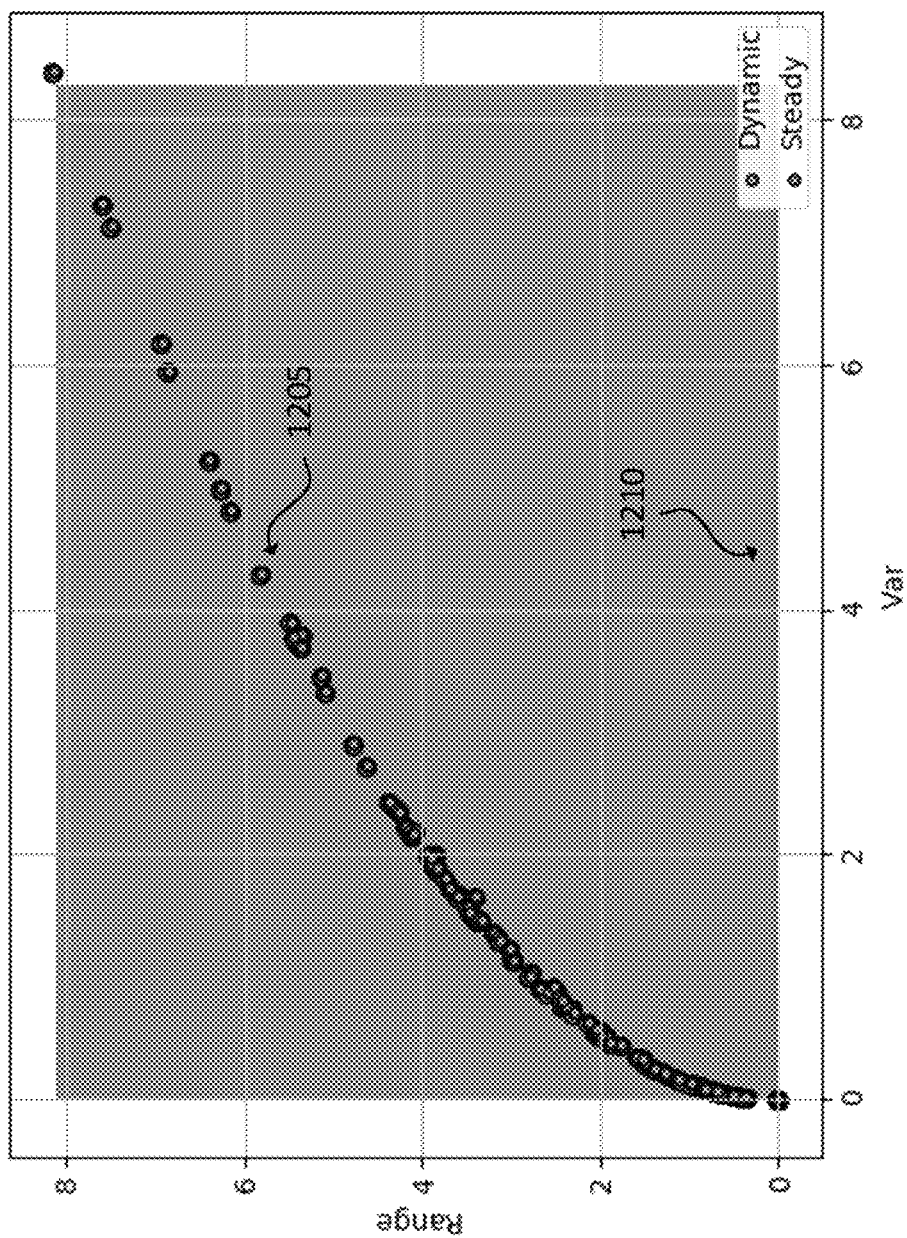
FIG. 12 shows example identification result of ambient and disturbance data.

FIG. 12 shows example identification result of ambient and disturbance data. The horizontal and vertical axes in FIG. 12 represent the voltage amplitude variance and the extreme value difference, respectively. The dot line 1205 is ambient data and the dot line 1210 is disturbance data. As illustrated in FIG. 12, the ambient and disturbance data is well distinguished, and accuracy is 100%. The running time of the identification method is about 0.005 s, which is much shorter than the running time of the recovery method. So, in this disclosure the running time of the described method only contains the running time of the recovery method.

Figure 13:
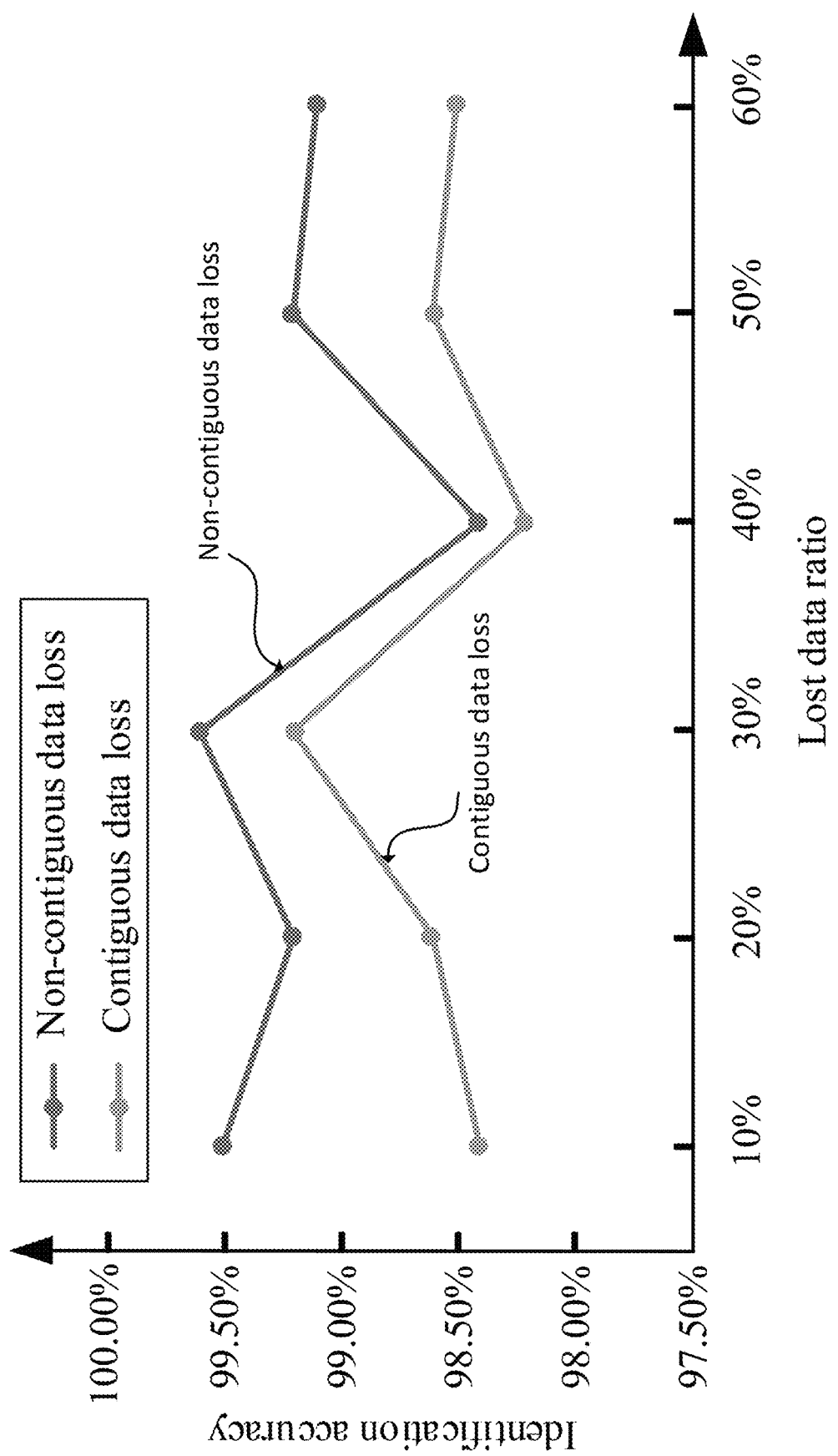
FIG. 13 shows example identification result of ambient and disturbance data when some data is lost.

Then, ambient and disturbance data is set lost randomly, including contiguous data loss and non-contiguous data loss. FIG. 13 shows example identification result of ambient and disturbance data when some data is lost. FIG. 13 shows that regardless of the data loss situation, the identification algorithm can accurately identify ambient and disturbance data. The accuracy of non-contiguous data loss is slightly higher than contiguous data loss. It can be seen that the amount of data loss has slight effect on the identification algorithm. Because the variance and extreme value difference of each group can represent the difference between ambient data and disturbance data. The variance and extreme value difference of ambient data are smaller than those of disturbance data. If there is some missing data in a group, the subsequent data will be filled in the group. The variance and extreme value difference of the group will not be affected much. The decision tree can identify the label of the group according to the features $a_i$ and $b_i$.

6.1.2. Simulation of Ambient Data Recovery Method

Under ideal conditions, the data of the power system is ambient and has no external interference. The general expression of its signal is as follows:

$$x(t) = \sqrt{2} X_m \cos(2\pi f_0 t + \varphi_0) \quad (33)$$

where $X_m$ is the phasor amplitude, $f_0$ represents power frequency, $\varphi_0$ is the initial phases, $X_m=57.73$ kV, $f_0=50$ Hz, and $\varphi_0=0$.

When the frequency offset occurs, only considering the frequency variation caused by load and generator output frequency imbalance, and the system operates near the rated frequency. The frequency offset signal is expressed as follows:

$$x(t) = \sqrt{2} X_m \cos[2\pi (f_0 + \Delta f)t + \varphi_0] \quad (34)$$

where $\Delta f$ is the frequency offset. $\Delta f=5$ Hz.

In the simulation, the size of dataset used in the simulation is 500. Each experiment in the simulation is repeated 10 times. There are three types of data loss, which are single data loss, non-contiguous data loss, and contiguous data loss. The data loss ratio of non-contiguous and contiguous data loss is 30%.

For ambient data, the described method does not require parameter settings. It selects the appropriate known data and order for recovery based on the priority allocation strategy. The parameters of OLAP method can be set using known techniques, where L=10, κ=6, $e_a=0.002$, η=2.4.

1) Optimal Number of Data Points for Interpolation

The single randomly selected missing data is recovered by this method. Tests are repeated 20 times, and results of TVE are the same owing to its periodicity. Results are as followed in Table 1.

TABLE 1

| Optimal data points for interpolation | | | | | | |
|---|---|---|---|---|---|---|
| Data Points | 2 | 4 | 6 | 8 | 9 | 10 |
| TVE | 4.89% | 0.16% | 0.06% | 0.07% | 0.07% | 0.07% |

Table 1 shows that starting from eight points, TVE is constant and missing data is efficiently recovered. So, eight fore-and-spatial points are used to recover missing data.

2) Simulation of Ambient Data Recovery

First, some data of the ideal signal Eq. (33) without noise is randomly selected as the missing data. The mean values of TVE of recovered data and the running time of three methods are compared in Tables 2 and 3.

TABLE 2

Comparison of recovery accuracy of three methods

| Data loss type | $TVE_L$/% | $TVE_O$/% | $TVE_C$% |
|---|---|---|---|
| Single data loss (one data loss) | 0 | 0 | 0 |
| Non-contiguous data loss (30% loss) | 0 | 0 | 0 |
| Contiguous data loss (30% loss) | 0 | 0 | 0 |

TABLE 3

Comparison of running time of three methods

| Data loss type | $Time_L$/s | $Time_O$/s | $Time_C$/s |
|---|---|---|---|
| Single data loss (one data loss) | 1.02 | 1.22 | 1.08 |
| Non-contiguous data loss (30% loss) | 2.18 | 3.28 | 2.24 |
| Contiguous data loss (30% loss) | 2.24 | 3.52 | 2.31 |

In Tables 2 and 3, L represents the recovery result of Lagrange interpolation method, C represents the described recovery result of ambient data recovery method. O represents the recovery result of OLAP method. The results show that the amplitude, phase, frequency, and frequency change rate of the above signal do not change, and the output result is constant. At this point, the signal characteristics are obvious, and the PMU missing data is easy to recover. Therefore, three methods can effectively recover different types of missing data. For the running time of three methods, when there is single data loss, $Time_L$ (1.02 s) is shorter than $Time_C$ (1.08 s) and $Time_O$ (1.22 s). When there is multiple data loss, $Time_L$ is 2.18 s and $Time_C$ is 2.24 s. The running time of OLAP becomes 3.28 s. So, the Lagrange method and the described method are faster than the OLAP method, especially when there is multiple missing data.

Figure 14:
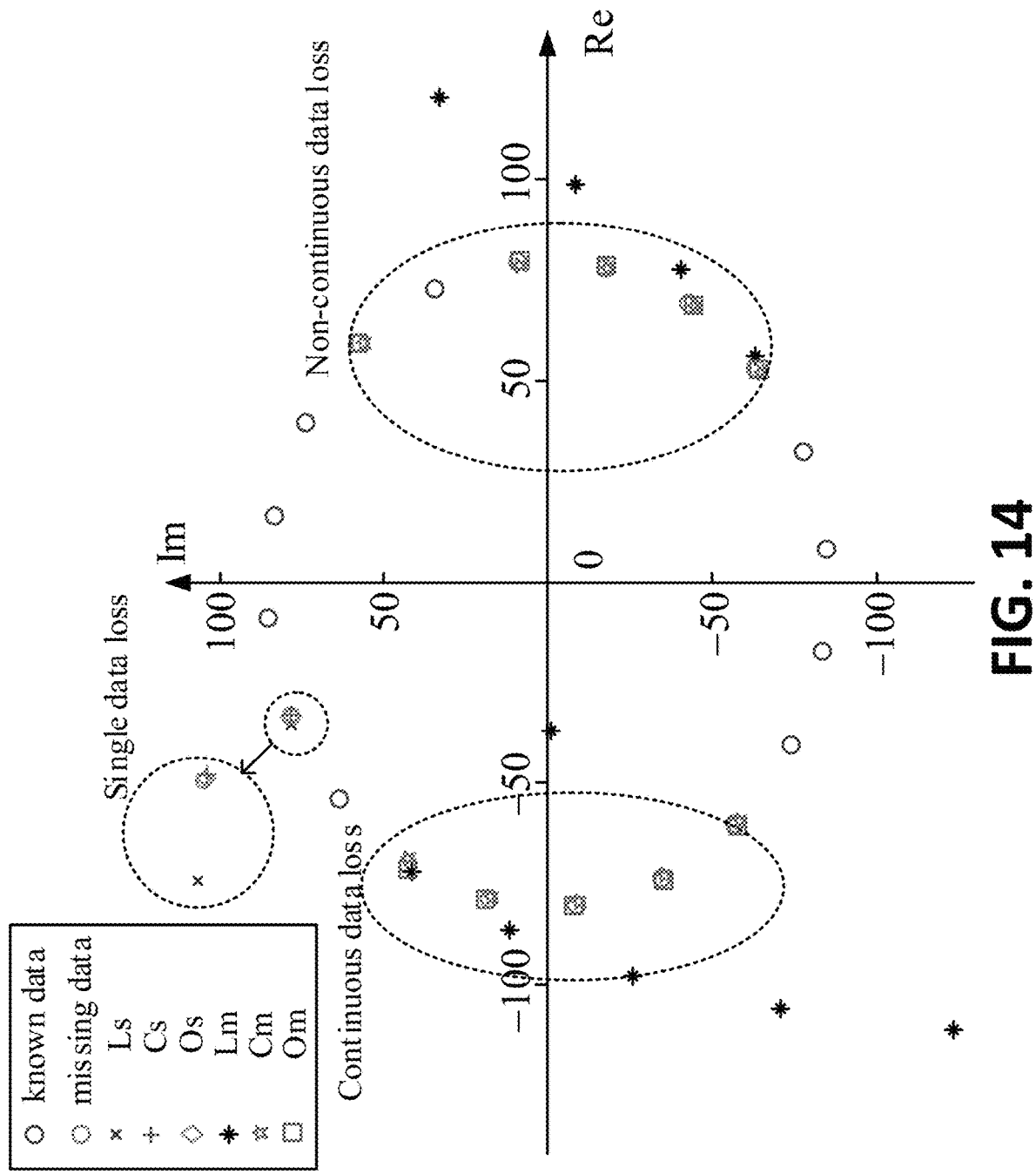
FIG. 14 shows example results of three methods for different data loss types.

When the power system is in normal operation, the frequency offset usually occurs. According to C37.118.1.a-2014 IEEE Standard, the maximum range of frequency offset is from −5 Hz to +5 Hz. The signal Eq. (34) can be used to compare the recovery of three methods. FIG. 14 shows example results of three methods for different data loss types. Tables 4, 5 and 6 also show similar results.

In particular, the recovery result of different types of missing data for the frequency offset signal in the complex plane is illustrated in FIG. 14. The horizontal and vertical axes are the real and imaginary parts, respectively. The Ls and Lm are the results recovered by Lagrange method (s means single missing data, m means multiple missing data, the following are the same), Cs and Cm are the results recovered by the described ambient data recovery method, Os and Om are the results recovered by OLAP method. For single data loss, the result of the described method (TVE=0.07%) is better than Lagrange method (TVE=3.06%), almost the same as OLAP method (TVE=0.05%). For non-contiguous data loss, the TVE results are presented in Table 4. The mean TVE of the described method is 0.652%, which is much smaller than Lagrange method (TVE=50.05%) and slightly larger than OLAP method (TVE=0.54%). For contiguous data loss, Table 5 shows that Lagrange method experiences serious distortion with an increase of missing data. The mean TVE of the described method is 0.73% and TVE of OLAP method is 0.636%. The recovery of these two methods is close. The running time of three methods is shown in Table 6. It indicates that when there is single data loss, $Time_L$ is 0.86 s. The running time of the described method is similar to Lagrange method. $Time_O$ is 1.36 s. When there is multiple missing data, the running time of OLAP method is about 2 times than the other methods. Its computational efficiency is affected by the amount of missing data. Therefore, the described method can recover the missing data precisely. And its calculation speed is faster.

TABLE 4

Comparison of recovery accuracy of three methods in non-contiguous data loss

| Data Point | $TVE_L$/% | $TVE_O$/% | $TVE_C$/% |
|---|---|---|---|
| Data 1 | 3.06 | 0.54 | 0.77 |
| Data 2 | 12.14 | 0.68 | 0.73 |
| Data 3 | 29.95 | 0.42 | 0.64 |
| Data 4 | 58.92 | 0.57 | 0.71 |
| Data 5 | 146.18 | 0.47 | 0.41 |

TABLE 5

Comparison of recovery accuracy of three methods in contiguous data loss

| Data Point | $TVE_L$/% | $TVE_O$/% | $TVE_C$/% |
|---|---|---|---|
| Data 1 | 3.06 | 0.73 | 0.84 |
| Data 2 | 12.14 | 0.58 | 0.67 |
| Data 3 | 29.95 | 0.67 | 0.58 |
| Data 4 | 58.92 | 0.67 | 0.81 |
| Data 5 | 101.03 | 0.53 | 0.75 |

TABLE 6

Comparison of running time of three methods

| Data loss type | $Time_L$/s | $Time_O$/s | $Time_C$/s |
|---|---|---|---|
| Single data loss | 0.86 | 1.36 | 0.88 |
| Non-contiguous data loss | 1.02 | 2.24 | 1.13 |
| Contiguous data loss | 1.26 | 2.41 | 1.32 |

6.1.3. Simulation of Disturbance Data Recovery Method

There are many types of disturbance signals in power systems. Two different signals are tested. First, we use the signal with amplitude and phase angle modulation to express the oscillation with low oscillation frequency. The signal expression is as follows:

$$x(t) = \sqrt{2}(X_m + X_d \cos(2\pi f_a t + \varphi_a))\cos(2\pi f_0 t + X_k \cos(2\pi f_a t + \varphi_a) + \varphi_0) \quad (35)$$

where $X_d$ is amplitude modulation depth, $X_k$ is phase angle modulation depth, $f_a$ is modulation frequency, $\varphi_a$ is the initial phase angle of modulation part, $X_d$=10%, $f_a$ 10 Hz, and $X_k$=5.7°.

For disturbance data, the parameters of the described method are set as follows: N=500, L=250, λ=0.0001. The parameters of OLAP method can also be set by known techniques, where L=10, κ=6, $e_a$=0.002, η=2.4. Consistent with the above steps, the results are recorded. The mean values of TVE of recovery results are shown in Table 7, and the running time of three methods is in Table 8.

TABLE 7

Comparison of recovery accuracy of the signal
with amplitude and phase angle modulation

| Data loss type | $TVE_L/\%$ | $TVE_O/\%$ | $TVE_S/\%$ |
|---|---|---|---|
| Single data loss (one data loss) | 2.50 | 0.85 | 0.28 |
| Non-contiguous data loss (30% loss) | 5.37 | 1.32 | 0.38 |
| Contiguous data loss (30% loss) | 5.22 | 1.54 | 0.77 |

TABLE 8

Comparison of running time of three methods

| Data loss type | $TVE_L/\%$ | $TVE_O/\%$ | $TVE_S/\%$ |
|---|---|---|---|
| Single data loss (one data loss) | 0.99 | 1.42 | 3.62 |
| Non-contiguous data loss (30% loss) | 2.04 | 4.54 | 4.45 |
| Contiguous data loss (30% loss) | 2.17 | 4.47 | 4.39 |

As seen from Tables 7 and 8, S means the described disturbance data recovery method. The accuracy of disturbance data recovery method is much higher than Lagrange method and improved at least 2 times than OLAP method. For the running time, when there is single data loss, $Time_L$ (0.99 s) is shorter than $Time_O$ (1.42 s) and $Time_S$ (3.62 s). Where there is multiple data loss, $Time_L$ is 2.17 s. $Time_O$ (4.47 s) is about 3 times as long as the single data loss. $Time_S$ (4.39 s) increases slightly. The running time of OLAP method increases with the missing data increases. The described method's running time is not sensitive to the amount of missing data.

To simulate the subsynchronous oscillation occurred in western China caused by inter-harmonics, the signal contains multiple inter-harmonics is used to do the simulation. The expression of the signal is as follows:

$$x(t) = \sqrt{2}\, X_{m0}\cos(2\pi f_0 t + \varphi_0) + \sqrt{2}\sum_{i=1}^{5} X_{mi}\cos(2\pi f_i t + \varphi_i) \quad (36)$$

where $X_{mi}$ is the amplitude of a certain harmonic phasor, $f_i$ is its harmonic frequency, and $\varphi_i$ is its initial phase angle. Additionally, $X_{m1}=1.2$ V, $f_1=22$ Hz, $\varphi_1=0°$. $X_{m2}=1.5$ V, $f_2=68$ Hz, $\varphi_2=0°$. $X_{m3}=2.4$ V, $f_3=74$ Hz, $\varphi_3=0°$. $X_{m4}=2.8$ V, $f_4=84$ Hz, $\varphi_4=0°$, $X_{m5}=3.4$ V, $f_5=96$ Hz, and $\varphi_5=0°$. The magnitude and phase angle of the superimposed phasor modulated at the frequencies of 18 Hz, 24 Hz, 28 Hz, 34 Hz and 46 Hz.

The mean values of TVE of the recovery results and the running time are presented in Tables 9 and 10.

TABLE 9

Comparison of recovery accuracy of
the signal with five inter-harmonics

| Data loss type | $TVE_L/\%$ | $TVE_O/\%$ | $TVE_S/\%$ |
|---|---|---|---|
| Single data loss (one data loss) | 0.25 | 0.05 | 0.014 |
| Non-contiguous data loss (30% loss) | 3.79 | 0.18 | 0.064 |
| Contiguous data loss (30% loss) | 4.38 | 0.14 | 0.042 |

TABLE 10

Comparison of running time of three methods

| Data loss type | $Time_L/s$ | $Time_O/s$ | $Time_S/s$ |
|---|---|---|---|
| Single data loss (one data loss) | 1.14 | 1.24 | 3.76 |
| Non-contiguous data loss (30% loss) | 2.08 | 4.74 | 4.59 |
| Contiguous data loss (30% loss) | 2.28 | 4.45 | 4.33 |

According to Tables 9 and 10, for the recovery of the subsynchronous oscillation signal, when there is single data loss, $TVE_S$ (0.014%) is smaller than $TVE_L$ (0.25%) and $TVE_O$ (0.05%). When the lost data ratio is 30%, TVES is 0.064%. The accuracy of the described method is at least 59 times better than Lagrange method and about 3 times better than OLAP method. For the running time, when there is single data point loss, $Time_L$ (1.14 s) is shorter than $Time_O$ (1.24 s) and Times (3.76 s). Where there is multiple data point losses, $Time_L$ is 2.08 s. $Time_O$ (4.47 s) is about 4 times longer than the $Time_O$ for single data point loss. $Time_S$ (4.39 s) is shorter than $Time_O$. The amount of missing data has an influence on the OLAP method. If there is lots of missing data points, the running time gets longer. The running time of the described method has no relationship with the data loss. Therefore, the described method can recover much disturbance missing data.

6.2. Field Data Test
6.2.1. Testing Platform Setup

Subsynchronous oscillation events caused by inter-harmonics have occurred numerous times in areas with renewable energy generation in western China. In this disclosure, field PMU data during a subsynchronous oscillation is used to verify the correctness of the described method by a test platform.

Figure 15:
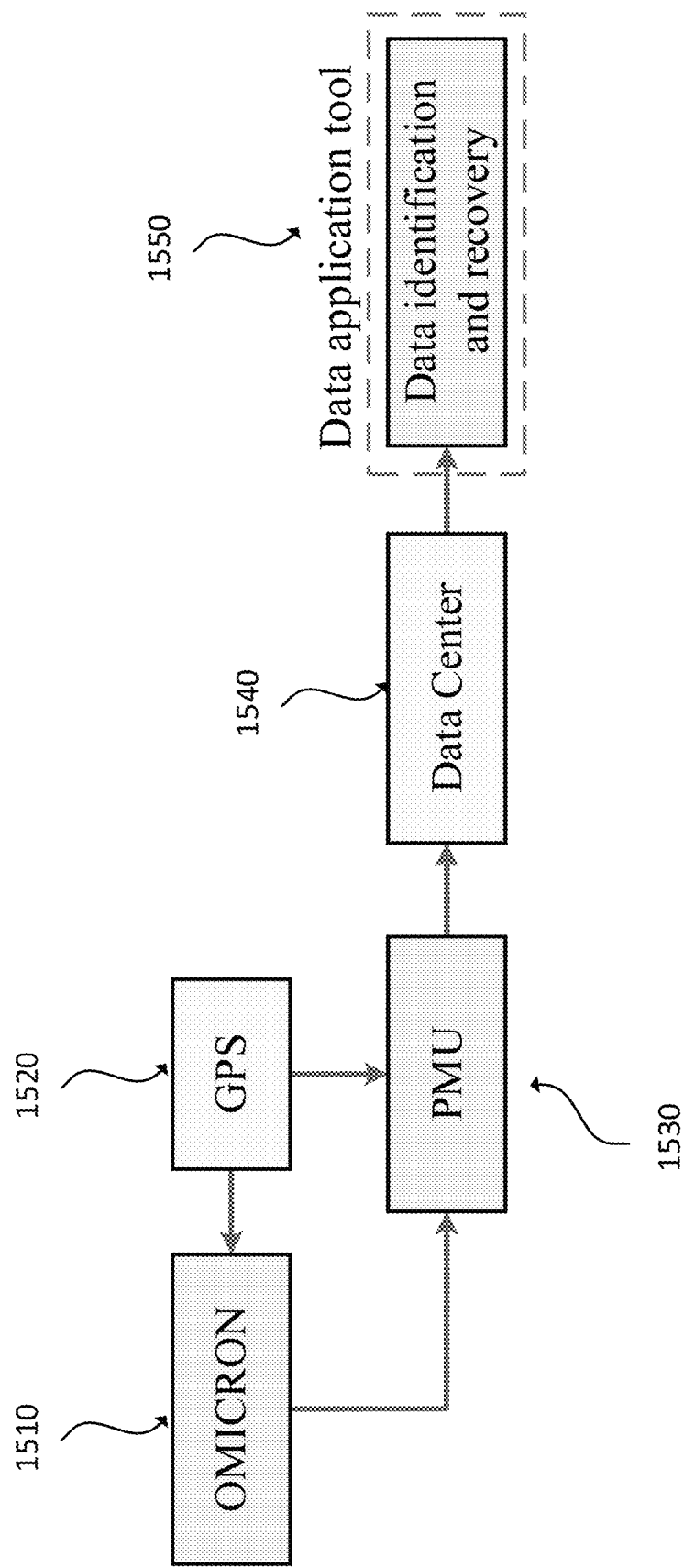
FIG. 15 shows a test platform according to an example embodiment.

FIG. 15 shows a test platform according to an example embodiment. The test platform is composed of a high accuracy generator (Omicron CMC256-plus) 1510, a GPS 1520, a PMU 1530, a data center 1540, as well as a data application tool 1550. In one example embodiment, the corresponding hardware setup the PMU is a self-developed measurement device of the renewable energy station (SMD-R).

Figure 16:
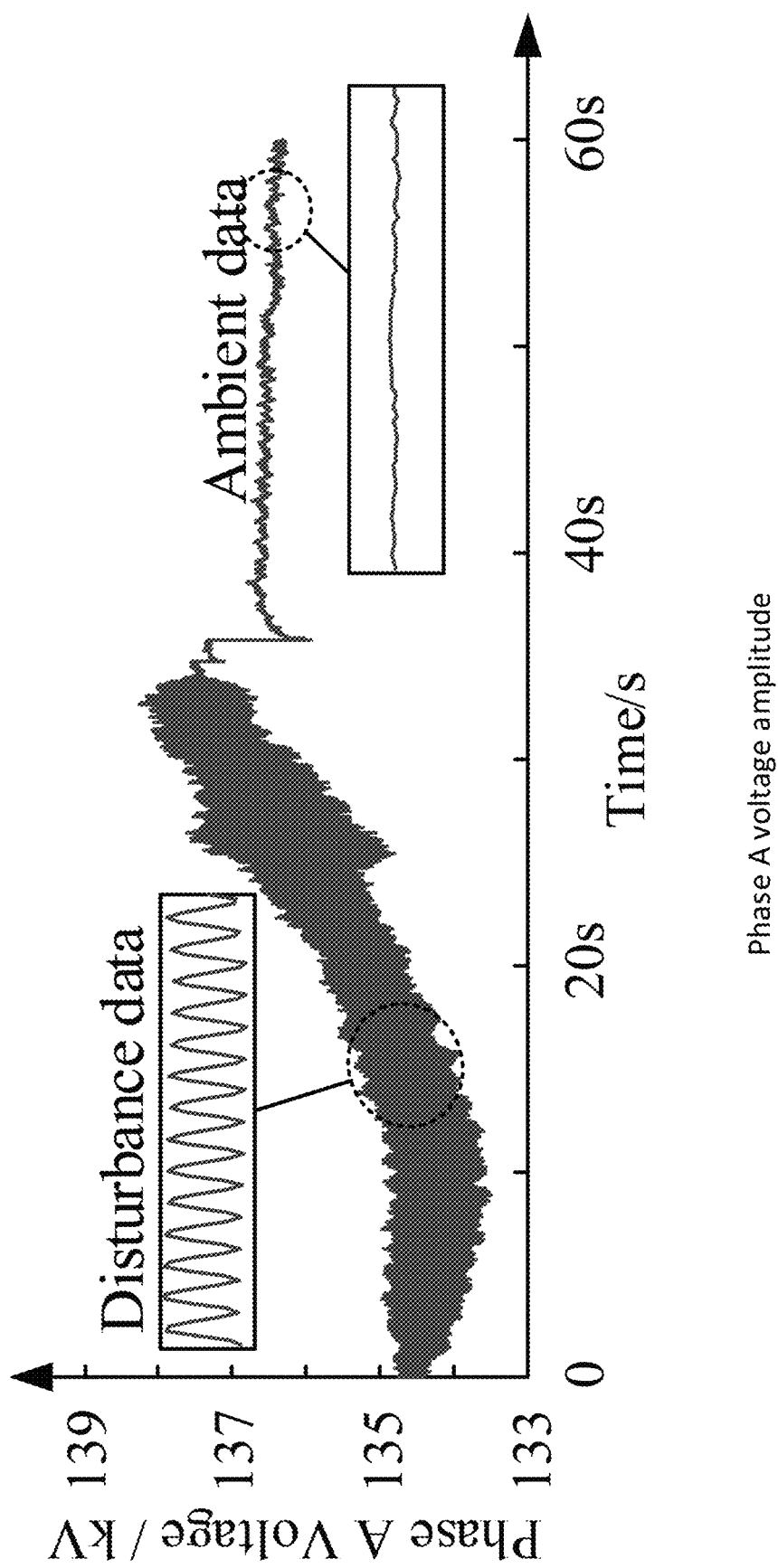
FIGS. 16 and 17 show example PMU measured interharmonic data.
Figure 17:
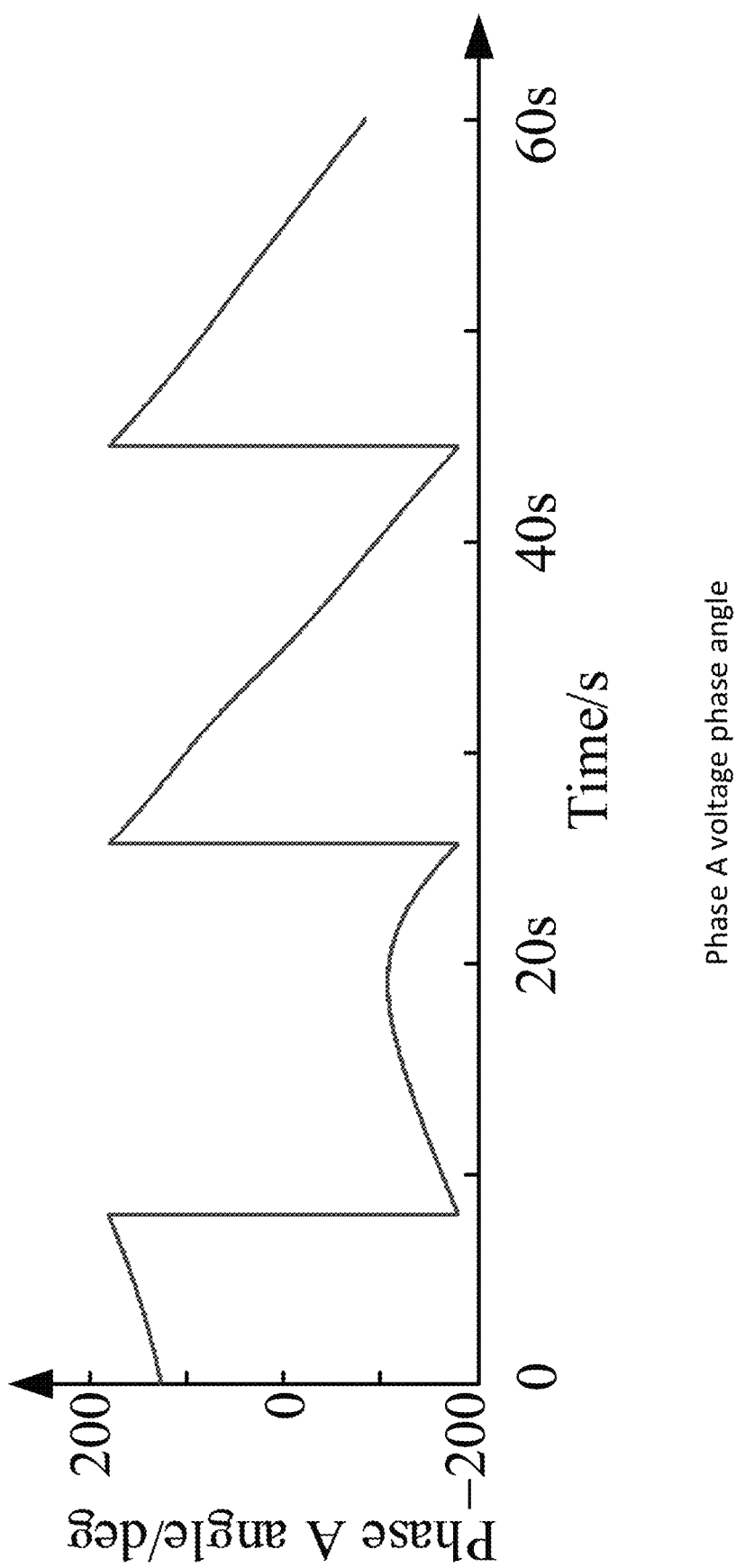

FIGS. 16 and 17 show example PMU measured inter-harmonic data. The generator is used to generate a signal restored from the field data, as shown in FIGS. 16 and 17, and it is sent out to the PMU. The PMU will then sense the signal, and upload the calculated dataset to the data center via Ethernet. In the data application tool, the PMU dataset is first randomly discarded, and then recovered using the developed data identification and recovery algorithm. The recovered PMU data is then compared with the field PMU data to validate the accuracy of the algorithm.

FIGS. 16 and 17 show that there is a single channel measurement and the reporting rate of PMU is 100 Hz. The subsynchronous oscillation lasts for about 33 seconds, then the grids arrive at the steady state. In one minute, 6000 field PMU data points exist, including voltage amplitude and angle.

6.2.2. Identification Method for Field Data

The field data in FIGS. 16 and 17 is input to the test platform, and the result are provided as follows.

Figure 18:
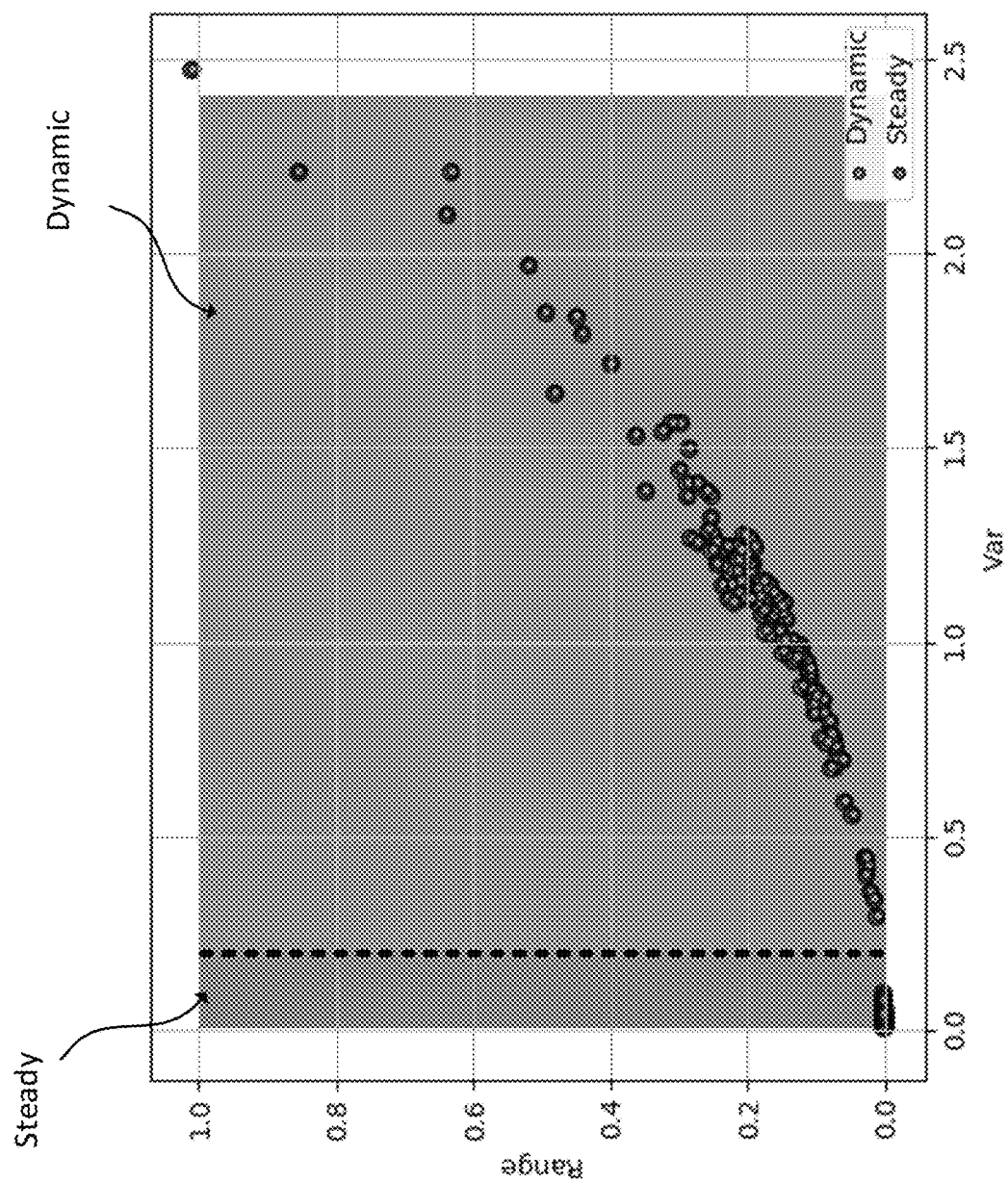
FIG. 18 shows example identification result of ambient and disturbance data.

FIG. 18 shows example identification result of ambient and disturbance data. As indicated in FIG. 18, the ambient and disturbance data is completely distinguished, and the accuracy is 100%.

Figure 19:
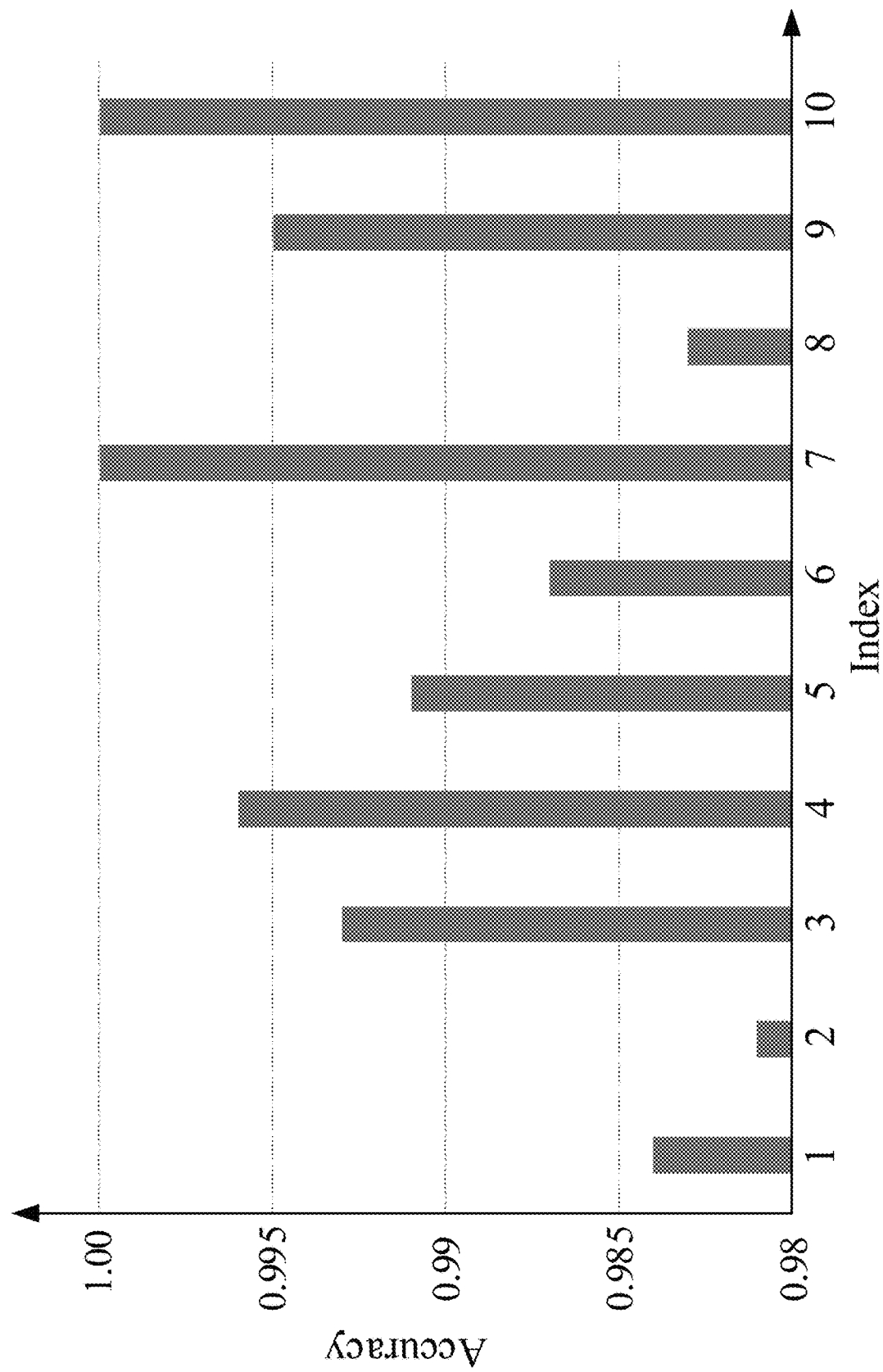
FIG. 19 shows example identification results of field data from different PMUs.

In order to verify the rationality of the parameter selection, ten other independent PMU measurement data points were validated to test its generalization ability. The measurement data of one PMU is extracted as test data each time. FIG. 19 shows example identification results of field data from different PMUs. It is shown from FIG. 19 that the selected parameters of the decision tree algorithm are applicable to field data from different PMUs, and the accuracy of the identification result is as high as 98%.

Figure 20:
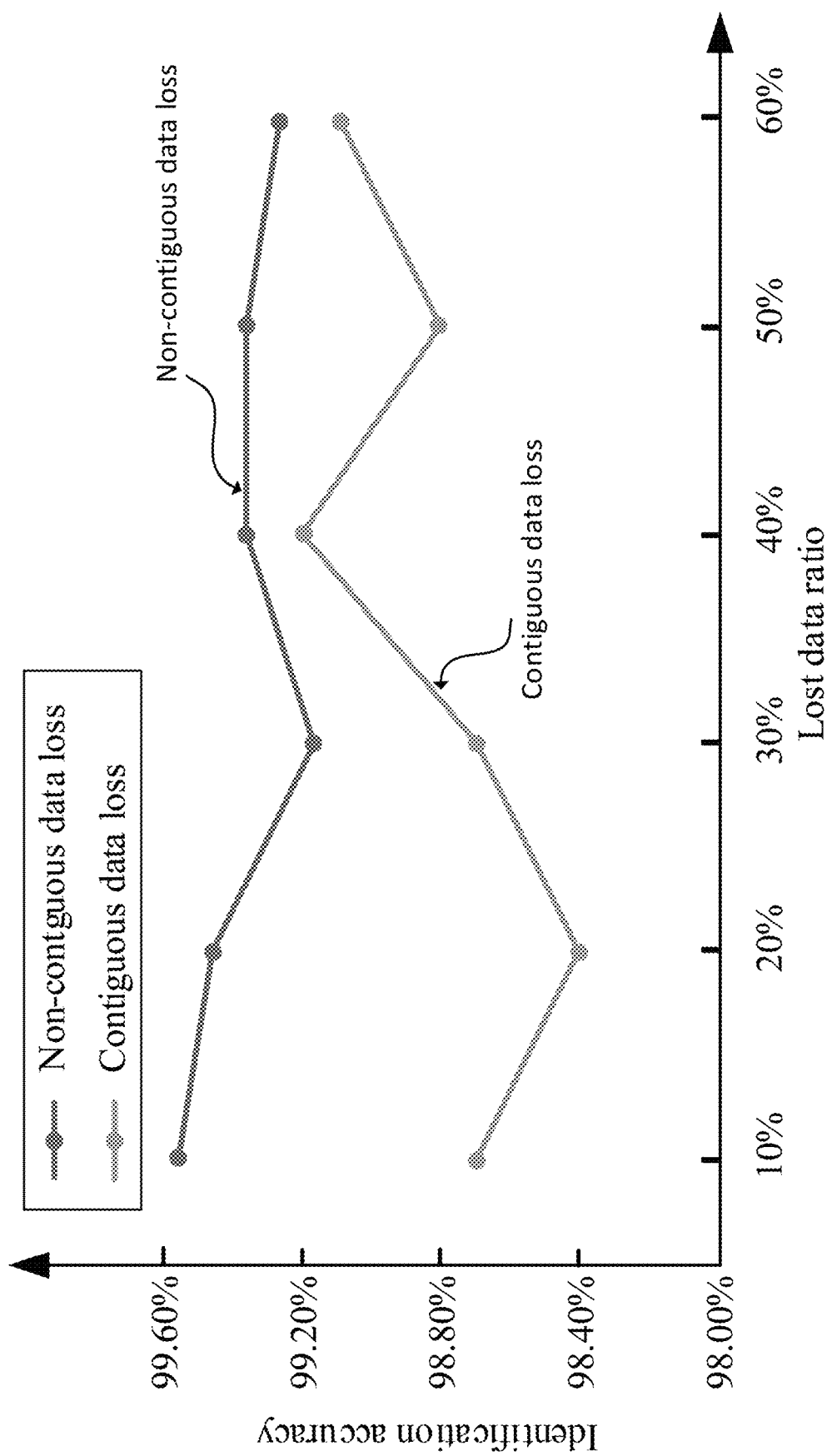
FIG. 20 shows identification result of ambient and disturbance data when some data is lost.

FIG. 20 shows identification result of ambient and disturbance data when some data is lost. FIG. 20 illustrates when field PMU data is lost, the identification algorithm can identify the ambient and disturbance data well and provide a basis for recovery. When the data is not contiguously lost, the recognition accuracy is slightly higher.

6.2.3. Field Data Verification of Ambient Data Method

For the ambient data, three methods are used to recover randomly selected single data, contiguous data, and non-contiguous data.

Figure 21:
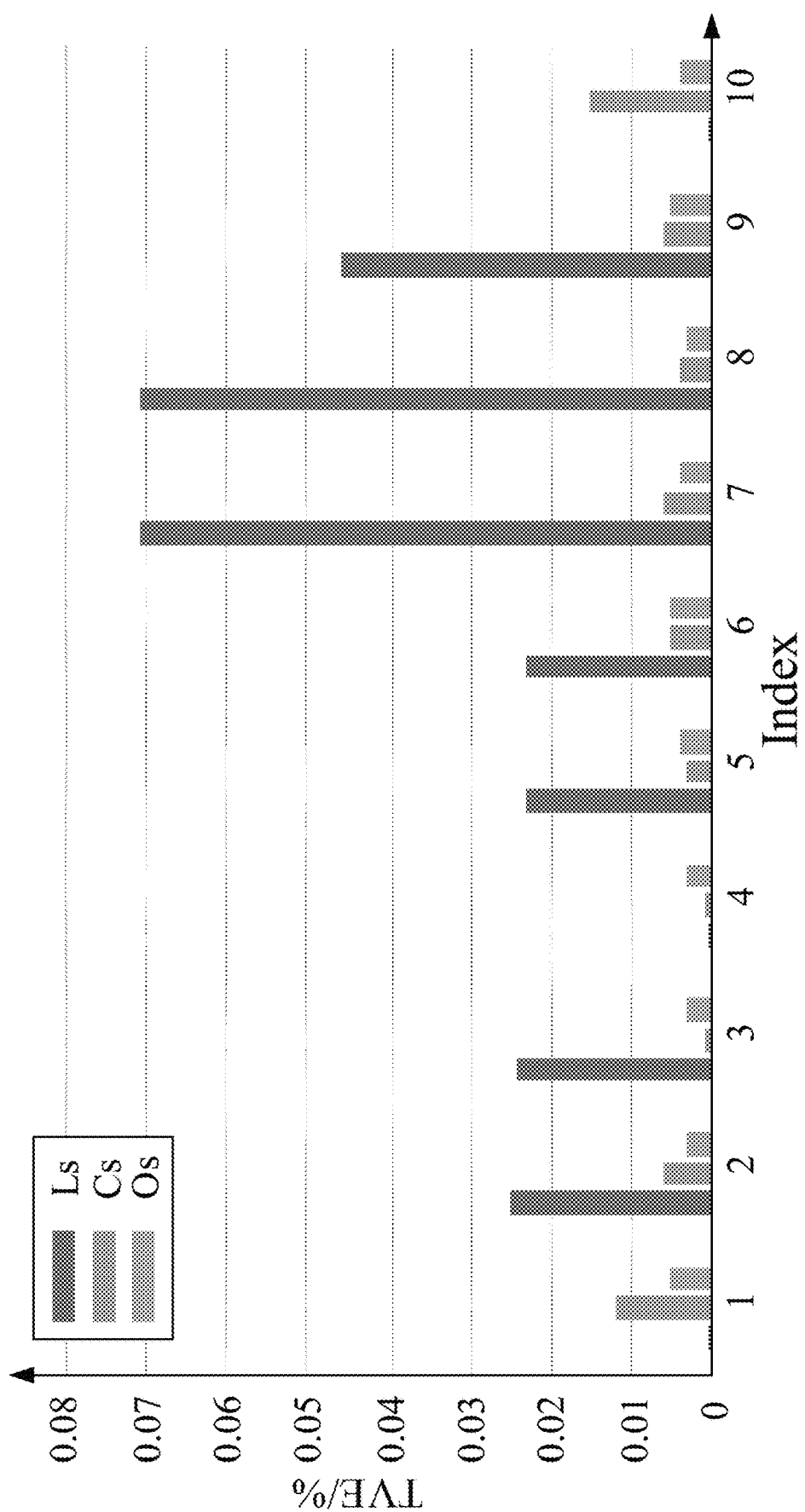
FIG. 21 shows example comparison of single data recovery results.
Figure 22:
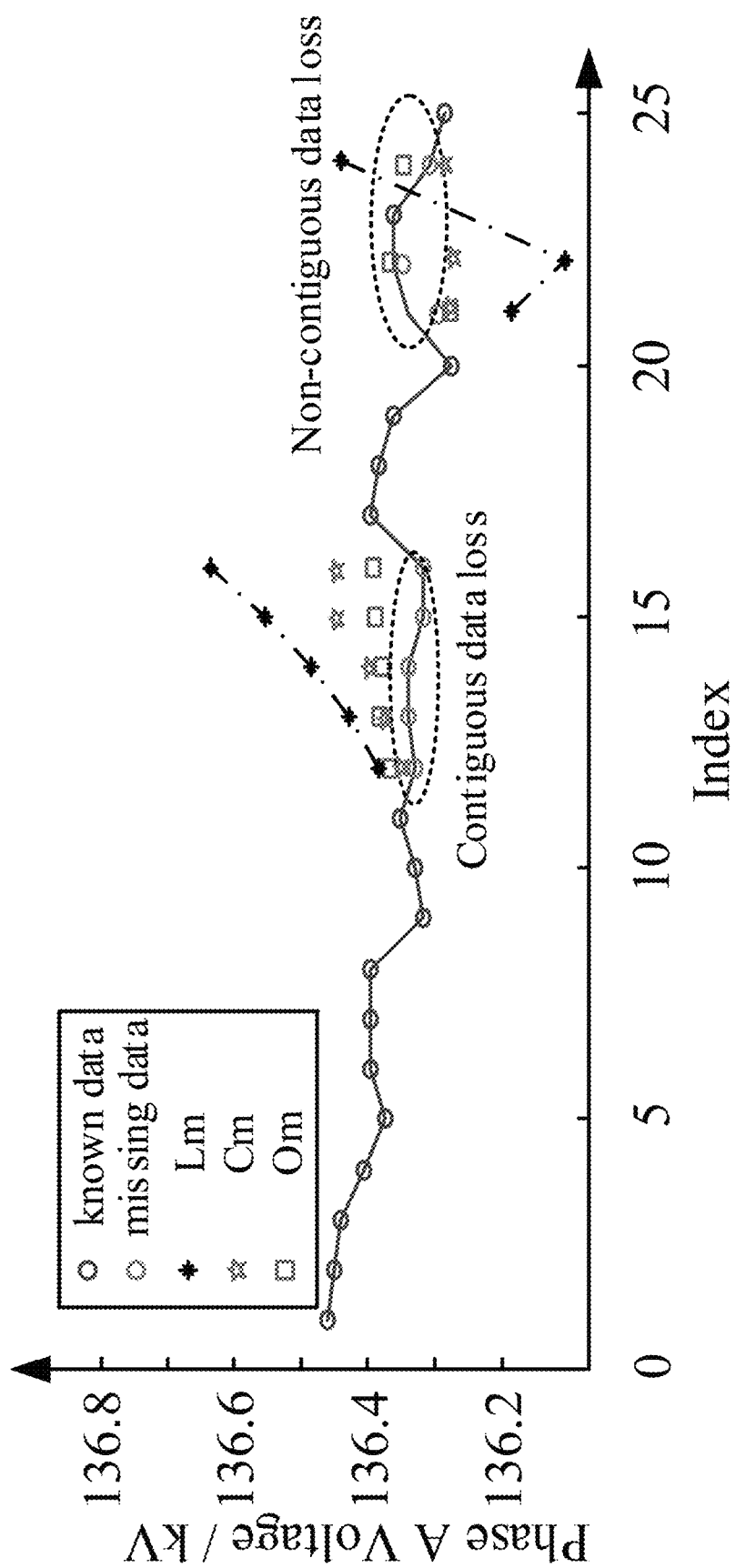
FIG. 22 shows example comparison of contiguous data and non-contiguous data recovery results.

FIG. 21 shows example comparison of single data recovery results. FIG. 22 shows example comparison of contiguous data and non-contiguous data recovery results. The comparison of running time is shown in Table 11.

TABLE 11

Comparison of running time of three methods

| Data loss type | $Time_L$/s | $Time_O$/s | $Time_S$/s |
|---|---|---|---|
| Single data loss | 0.75 | 1.37 | 0.98 |
| Non-contiguous data loss | 1.13 | 2.15 | 1.19 |
| Contiguous data loss | 0.98 | 2.41 | 1.21 |

From FIG. 21, it can be seen that for single data point loss, $TVE_L$ fluctuates significantly and the error changes greatly. Each $TVE_C$ and $TVE_O$ are relatively close, and less than 0.02%, which has obvious advantages compared with $TVE_L$. FIG. 22 shows that when there are multiple missing data points, $TVE_C$ is 0.12% and $TVE_O$ is 0.10%. Table 11 demonstrates that for the single data point loss, $Time_L$ (0.75 s) is shorter than $Time_O$ (1.37 s) and $Time_C$ (0.98 s). If there is multiple data point losses, the running time of OLAP becomes longer. $Time_O$ (2.41 s) is about two times than $Time_L$ (0.98 s). The running time of the described method ($Time_C$=1.21 s) is between the other two. So, the described ambient data recovery method is superior to the Lagrange method in accuracy and superior to the OLAP in running time.

6.2.4. Field Data Verification of Disturbance Data Method

Figure 23:
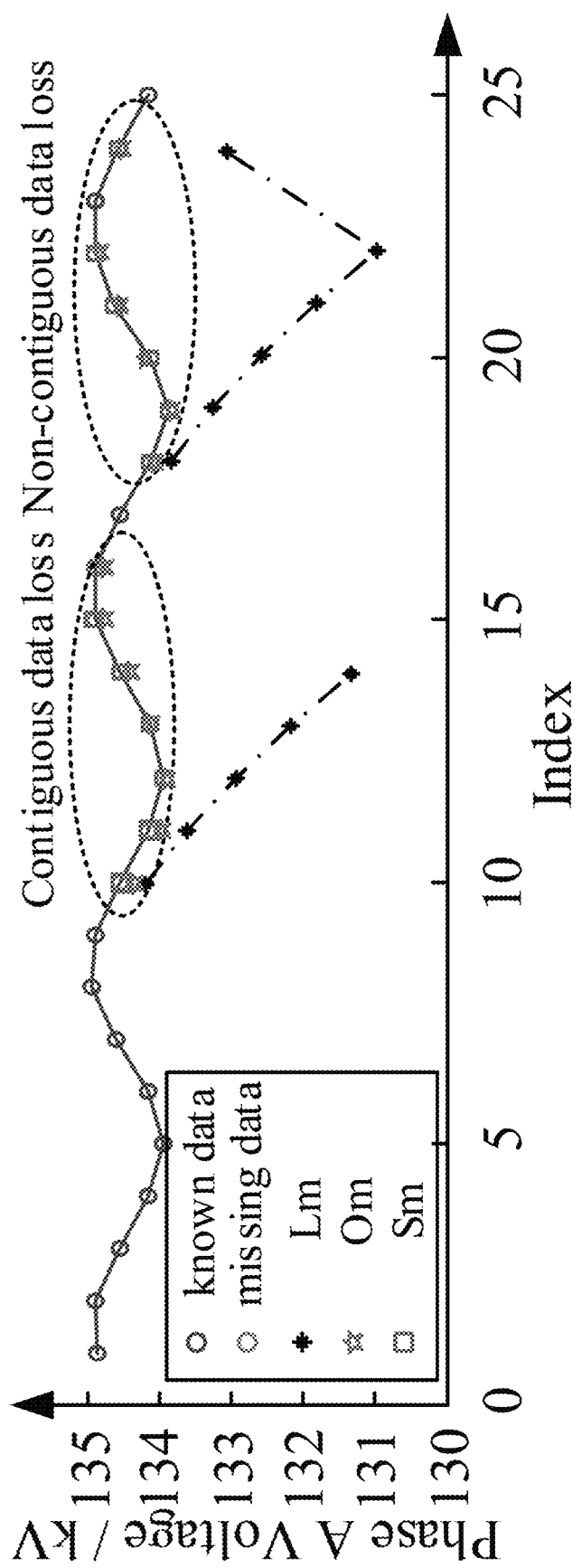
FIG. 23 shows example comparison of contiguous data and non-contiguous data recovery results.

For the disturbance data, three methods are used to recover randomly selected single data, contiguous data, and non-contiguous data. The results of 10 groups of single data loss are as in Table 12. FIG. 23 shows example comparison of contiguous data and non-contiguous data recovery results. The running time of three methods is in Table 13.

TABLE 12

Comparison of recovery results of 10 groups in single data loss

| Data Point | $TVE_L$/% | $TVE_O$/% | $TVE_S$/% |
|---|---|---|---|
| Data 1 | 4.16 | 0.07 | 0.025 |
| Data 2 | 6.76 | 0.04 | 0.015 |
| Data 3 | 3.21 | 0.08 | 0.039 |
| Data 4 | 6.06 | 0.07 | 0.014 |
| Data 5 | 2.45 | 0.05 | 0.006 |
| Data 6 | 0.74 | 0.01 | 0.018 |
| Data 7 | 2.53 | 0.06 | 0.025 |
| Data 8 | 1.69 | 0.04 | 0.032 |
| Data 9 | 6.52 | 0.05 | 0.019 |
| Data 10 | 5.86 | 0.04 | 0.014 |

TABLE 13

Comparison of running time of three methods

| Data loss type | $Time_L$/s | $Time_O$/s | $Time_S$/s |
|---|---|---|---|
| Single data loss | 1.14 | 1.35 | 3.53 |
| Non-contiguous data loss | 2.14 | 3.72 | 3.73 |
| Contiguous data loss | 2.17 | 3.75 | 3.68 |

Table 12 shows that for single data point loss, $TVE_S$ is all better than $TVE_O$ and $TVE_L$. The mean value of $TVE_S$ is 0.0207%, the mean value of $TVE_O$ is 0.051%, and the mean value of $TVE_L$ is 3.998%. FIG. 23 indicates that for the multiple data point losses, the change of $TVE_L$ is the same as that of the ambient data. The mean value of $TVE_L$ is 10.31%. The mean value of $TVE_O$ is below 0.1% and the mean value of $TVE_S$ is below 0.05%. Table 13 shows that when there is only single data loss, the running time of OLAP is 1.35 s. The running time of the described method is 3.53 s. When there is multiple data loss, the running time of OLAP becomes 3.75 s, while the described method is 3.68 s. Because when there is only single data loss, the running time of the described method is longer than OLAP. With the increase of data loss, the running time of OLAP method increases, and the running time of the described method does not change much. Because OLAP method recovers one data at a time, the number of missing data determines how many times the method runs. When a large amount of data is lost, the number of runs of OLAP method increases, which causes an increase in the running time. The described method relies on the iterative idea to recover the data with high precision. All the missing data can be recovered by one iteration. As the number of iterations increases, the recovered data is more accurate. The running time of the described method is related to the number of iterations and the amount of missing data has little effect on the number of iterations. The running time of OLAP method increases faster than the described method in this disclosure as the lost data ratio increases. Therefore, the described disturbance data recovery method has the higher precision and effectiveness. It is preferred especially when there is multiple missing data.

6.2.5. Impact of the Dataset Size on the Method

The running time of the four algorithms is compared by varying the dataset size N, which is shown in Table 14. In Table 14, the dataset size N is from 100 to 500. The data loss ratio is 30%. It can be seen that the running time of the Lagrange method and the described ambient data recovery method increases linearly with the increase of the dataset. These two methods run faster because the algorithm is simple. The running time of OLAP method increases. Because the running number increases with the increase of the dataset. The running time of the described disturbance data recovery method is less affected by the dataset. Because the running time mainly depends on the number of iterations and the dataset has less impact on it. When the dataset size is from 100 to 400, the running time of OLAP method is shorter than the described disturbance recovery method. When the dataset size N is 500, the running time of the described disturbance data recovery method is shorter than OLAP method. It is because that the number of runs of OLAP method increases as the dataset size increases, and the number of iterations of the described disturbance data recovery method is almost constant. Therefore, when the dataset size is large, the running time of the described disturbance data recovery method is shorter.

TABLE 14

Impact of the dataset size on the method

| Dataset size N | $Time_L$/s | $Time_O$/s | $Time_C$/s | $Time_S$/s |
|---|---|---|---|---|
| 100 | 0.41 | 1.42 | 0.39 | 3.32 |
| 200 | 0.63 | 2.15 | 0.65 | 3.75 |
| 300 | 1.24 | 2.85 | 1.28 | 3.89 |
| 400 | 1.76 | 3.66 | 1.84 | 4.16 |
| 500 | 2.24 | 4.45 | 2.31 | 4.33 |

6.2.6. Impact of Data Loss Ratio on the Method

The recovery of the four methods are compared by changing the percentage of contiguous lost field data, which is shown in Table 15. According to Table 15, the accuracy of Lagrange method decreases quickly with the increasing data loss. OLAP method cannot recover the missing data precisely when the ratio is higher than 30%. As for the described ambient data recovery method, when the loss ratio is less than 15%, the mean TVE is 0.65%. As for the described disturbance data recovery method, if 40% disturbance data is lost, the mean TVE is still 0.86%. The described disturbance data recovery method can recover data accurately with a large amount of data loss.

TABLE 15

Impact of data loss on four methods

| Data loss ratio | $Time_L$/s | $Time_O$/s | $Time_C$/s | $Time_S$/s |
|---|---|---|---|---|
| 10% | 3.22 | 0.21 | 0.25 | 0.004 |
| 15% | 4.82 | 0.54 | 0.65 | 0.004 |
| 20% | 6.53 | 0.76 | 1.86 | 0.15 |
| 30% | 8.17 | 3.24 | 5.37 | 0.32 |
| 40% | 20.64 | 9.37 | 13.35 | 0.86 |
| 50% | 45.14 | 23.43 | 29.85 | 16.57 |
| 60% | 81.23 | 35.78 | 51.35 | 28.34 |

7. Conclusion

This disclosure described an adaptive PMU missing data recovery method. This technique can quickly and accurately recover different types of missing data of ambient and disturbance data, and guarantee the data foundation for the subsequent application of PMU data in the system.

In particular, the adaptive PMU missing data recovery method can choose the appropriate recovery method based on the types of data loss to meet the speed and accuracy requirements. Additionally, the identification method can accurately identify the simulation and field PMU data. The method can still perform well under the high data loss ratio. Moreover, for the ambient data, the improved cubic interpolation method based on priority allocation strategy has high calculation accuracy and good computational efficiency for large amounts of data. For the disturbance data, the method based on singular value decomposition has good recovery accuracy and the calculation efficiency does not change much even if there is lots of missing data.

8. Technical Implementation of a Computer System

Figure 24:
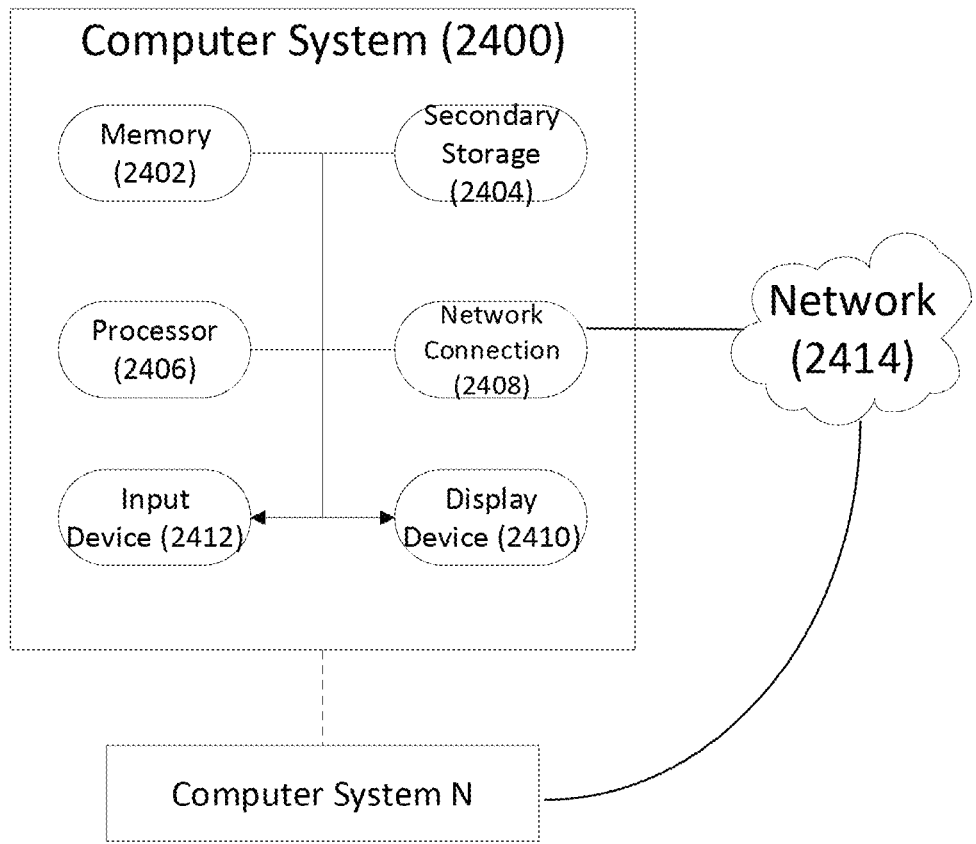
FIG. 24 illustrates exemplary hardware components for a computer system including a controller.

FIG. 24 illustrates exemplary hardware components of a computer system, which may be similar to a controller. A computer system 2400, or other computer systems similarly configured, may include and execute one or more subsystem components to perform functions described herein, including the steps of various flow processes described above. Likewise, a mobile device, a cell phone, a smartphone, a laptop, a desktop, a notebook, a tablet, a wearable device, a server, etc., which includes some of the same components of the computer system 2400, may run an application (or software) and perform the steps and functionalities described above. Computer system 2400 may connect to a network 2414, e.g., Internet, or other network, to receive inquiries, obtain data, and transmit information and incentives as described above.

The computer system 2400 typically includes a memory 2402, a secondary storage device 2404, and a processor 2406. The computer system 2400 may also include a plurality of processors 2406 and be configured as a plurality of, e.g., bladed servers, or other known server configurations. The computer system 2400 may also include a network connection device 2408, a display device 2410, and an input device 2412.

The memory 2402 may include RAM or similar types of memory, and it may store one or more applications for execution by processor 2406. Secondary storage device 2404 may include a hard disk drive, floppy disk drive, CD-ROM drive, or other types of non-volatile data storage. Processor 2406 executes the application(s), such as those described herein, which are stored in memory 2402 or secondary storage 2404, or received from the Internet or other network 2414. The processing by processor 2406 may be implemented in software, such as software modules, for execution by computers or other machines. These applications preferably include instructions executable to perform the system and subsystem component functions and methods described above and illustrated in the FIGS. herein. The applications preferably provide graphical user interfaces (GUIs) through which users may view and interact with subsystem components.

The computer system 2400 may store one or more database structures in the secondary storage 2404, for example, for storing and maintaining the information necessary to perform the above-described functions. Alternatively, such information may be in storage devices separate from these components.

Also, as noted, processor 2406 may execute one or more software applications to provide the functions described in this specification, specifically to execute and perform the steps and functions in the process flows described above. Such processes may be implemented in software, such as software modules, for execution by computers or other machines. The GUIs may be formatted, for example, as web pages in HyperText Markup Language (HTML), Extensible Markup Language (XML) or in any other suitable form for presentation on a display device depending upon applications used by users to interact with the computer system 2400.

The input device 2412 may include any device for entering information into the computer system 2400, such as a touch-screen, keyboard, mouse, cursor-control device, microphone, digital camera, video recorder or camcorder. The input and output device 2412 may be used to enter information into GUIs during performance of the methods described above. The display device 2410 may include any type of device for presenting visual information such as, for example, a computer monitor or flat-screen display (or mobile device screen). The display device 2410 may display the GUIs and/or output from sub-system components (or software).

Examples of the computer system 2400 include dedicated server computers, such as bladed servers, personal computers, laptop computers, notebook computers, palm top computers, network computers, mobile devices, or any processor-controlled device capable of executing a web browser or other type of application for interacting with the system.

Although only one computer system 2400 is shown in detail, system 2400 may use multiple computer systems or servers as necessary or desired to support the users and may also use back-up or redundant servers to prevent network downtime in the event of a failure of a particular server. In addition, although computer system 2400 is depicted with various components, one skilled in the art will appreciate that the system can contain additional or different components. In addition, although aspects of an implementation consistent with the above are described as being stored in a memory, one skilled in the art will appreciate that these aspects can also be stored on or read from other types of computer program products or computer-readable media, such as secondary storage devices, including hard disks, floppy disks, or CD-ROM; or other forms of RAM or ROM. The computer-readable media may include instructions for controlling the computer system 2400, to perform a particular method, such as methods described above.

The present disclosure is not to be limited in terms of the particular embodiments described in this application, which are intended as illustrations of various aspects. Many modifications and variations can be made without departing from its spirit and scope, as may be apparent. Functionally equivalent methods and apparatuses within the scope of the disclosure, in addition to those enumerated herein, may be apparent from the foregoing representative descriptions. Such modifications and variations are intended to fall within the scope of the appended representative claims. The present disclosure is to be limited only by the terms of the appended representative claims, along with the full scope of equivalents to which such representative claims are entitled. It is also to be understood that the terminology used herein is for the purpose of describing particular embodiments only, and is not intended to be limiting.

The invention claimed is:

1. A method for improving a data quality of a phasor measurement unit including a processor and a memory, the method comprising:
   obtaining, using an interface of the phasor measurement unit, a plurality of datasets $C_i$ including a plurality of data points from a power network;
   dividing, using the processor, each dataset $C_i$ into ambient data or disturbance data using a binary classification model stored on the memory and configured to perform the following steps:
   providing (S1) all the datasets $C_i$ as inputs to a decision tree;
   calculating (S2) gain ratios of features ($a_i$, $b_i$), and selecting a largest dataset $C_i$ for comparison with a threshold $\varepsilon$, wherein:
   the gain ratio is defined as follows:

$$g(T, a, q_i) = \frac{G(T, a, q_i)}{IV(a)}$$

-continued $$IV(a) = -\sum_{\beta \in \{-,+\}} \frac{|T_{q_i}^\beta|}{|T|} \log_2 \frac{|T_{q_i}^\beta|}{|T|}$$

where IV(a) is an intrinsic value; for each dataset $C_i$, $a_i$ is a variance, $b_i$ is an extreme value difference and $q_i$ is a diving point; and G(T, a, $q_i$) is information gain of $q_i$ which is computed as follows:

$$G(T, a, q_i) = H(T) - \frac{|T_{q_i}^-|}{|T|} H(T_{q_i}^-) \frac{|T_{q_i}^+|}{|T|} H(T_{q_i}^+)$$

where |T| represents the number of groups, $|T_{q_i}^-|/|T|$ is a weight of the groups in which $a_i \leq q_i$, and $|T_{q_i}^+|/|T|$ represents a weight of the groups where $a_i > q_i$;
   if the gain ratio is less than the threshold $\varepsilon$, the decision tree is a single node tree and a state of all the datasets is the state of a majority; and
   if the gain ratio is not less than the threshold $\varepsilon$, g(T, a, $q_a$) is the largest dataset $C_i$;
   comparing (S3) $a_i$ with $q_a$, and placing datasets $C_i$ with $a_i \leq q_a$ in a class for ambient data, and placing remaining datasets $C_i$ in a class for disturbance data; and
   repeating steps S1-S3 recursively until all datasets in each class are in the same state, or a maximum gain ratio is less than the threshold $\varepsilon$;
   restoring missing data from the class of ambient data by:
   determining a number E and a type of data points missing, wherein the number E represents a number of missing data points;
   implementing a priority allocation strategy based on the number E and the type of data points missing;
   determining an improved cubic spline interpolation function that satisfies an extreme value difference constraint and a missing data, wherein S(t) is the cubic spline interpolation function of $f(t)$ on node $t_0$, $t_1, \ldots, x_n$ as written below:

$$S(t) = M_i \frac{(t_{i+1} - t)^3}{6h_i} + M_{i+1} \frac{(t - t_i)^3}{6h_i} + \left(\frac{X_i}{h_i} - \frac{M_i}{6} h_i\right)(t_{i+1} - t) + \left(\frac{X_{i+1}}{h_i} - \frac{M_{i+1}}{6} h_i\right)(t - t_i)$$

where $M_i = S''(t_i)$, wherein:
   on each subinterval [$t_k$, $t_{k+1}$] (k=1, 2, \ldots, n-1), S(t) is a polynomial no more than three times, and $s(t_i) = X_i$;
   in interval [$t_i$, $t_{i+1}$], the second derivative of S(t) is expressed as:

$$S''(t) = M_i \frac{t_{i+1} - t}{h_i} + M_{i+1} \frac{t - t_i}{h_i}$$

where $h_i = t_{i+1} - t_i$; and
   two consecutive integrations of S''(t) provide:

$$S'(t) = -M_i \frac{(t_{i+1} - t)^2}{2h_i} + M_{i+1} \frac{(t - t_i)^2}{2h_i} + \frac{X_{i+1} - X_i}{h_i} - \frac{M_{i+1} - M_i}{6} h_i;$$

and
   restoring the missing data using the cubic spline interpolation function and known data;

restoring missing data from the class of disturbance data by:

determining an amount of data N and a number of rows of a track matrix L according to an actual data loss position;

constructing a trajectory matrix and performing singular value decomposition to extract all characteristic components by mapping a one-dimensional time series X to a trajectory matrix Y of a high-dimensional space as follows:

$$X = [X_{t_1}, X_{t_2}, \ldots, X_{t_N}] \rightarrow Y = [Y_1, Y_2, \ldots Y_K]$$

$$Y_z = [X_z, X_{z+1}, \ldots, X_{z+L-1}]^T, z = 1, 2, \ldots, K$$

$$Y = \begin{bmatrix} X_{t_1} & X_{t_2} & \ldots & X_{t_m} & \ldots & X_{t_n} & \ldots & X_{t_K} \\ X_{t_2} & X_{t_3} & \ldots & X_{t_{m+1}} & \ldots & X_{t_{n+1}} & \ldots & X_{t_{K+1}} \\ \vdots & \vdots & \vdots & \vdots & \vdots & \vdots & \vdots & \vdots \\ X_{t_L} & X_{t_{L+1}} & \ldots & X_{t_{m-1+L}} & \ldots & X_{t_{n-1+L}} & \ldots & X_{t_N} \end{bmatrix}$$

where the matrix Y is a Hankel matrix which has equal elements $Y_{ij}$ on anti-diagonals i+j=const; subscript L is a number of matrix rows, which measure the dimension of the matrix Y, and K is a number of matrix columns, K=N−L+1;

reconstructing an original sequence using an optimal characteristic component, wherein the original sequence X decomposition is reconstructed into a sum X(1) of k sequences $[X^{(1)}, X^{(2)}, \ldots, X^{(k)}]$, where:

$$X^{(k)} = [X_{t_1}^{(k)}, X_{t_2}^{(k)}, \ldots, X_{t_{N-1}}^{(k)}, X_{t_N}^{(k)}]$$

$$X(1) \leftrightarrow \begin{bmatrix} X_{t_1}^{(1)} & X_{t_2}^{(1)} & \ldots & X_{t_{N-1}}^{(1)} & X_{t_N}^{(1)} \\ X_{t_1}^{(2)} & X_{t_2}^{(2)} & \ldots & X_{t_{N-1}}^{(2)} & X_{t_N}^{(2)} \\ \vdots & \vdots & \vdots & \vdots & \vdots \\ X_{t_1}^{(k)} & X_{t_2}^{(k)} & \ldots & X_{t_{N-1}}^{(k)} & X_{t_N}^{(k)} \end{bmatrix}$$

replacing a missing data $X_{lost}$ by a corresponding position value of the reconstructed sequence X(1);

providing the missing data to the phasor measurement unit to support power system dynamic monitoring, power system state estimation, parameter identification, and/or closed-loop control.

* * * * *